(12) United States Patent
Ogura et al.

(10) Patent No.: US 7,118,961 B2
(45) Date of Patent: Oct. 10, 2006

(54) STITCH AND SELECT IMPLEMENTATION IN TWIN MONOS ARRAY

(75) Inventors: Tomoko Ogura, Hopewell Jct, NY (US); Tomoya Saito, Poughkeepsie, NY (US); Seiki Ogura, Wappingers Falls, NY (US); Kimihiro Satoh, Hopewell Jct, NY (US)

(73) Assignee: Halo LSI, Inc., Hillsboro, OR (US)

( * ) Notice: Subject to any disclaimer, the term of this patent is extended or adjusted under 35 U.S.C. 154(b) by 309 days.

(21) Appl. No.: 10/782,358

(22) Filed: Feb. 19, 2004

(65) Prior Publication Data

US 2004/0166630 A1    Aug. 26, 2004

Related U.S. Application Data

(62) Division of application No. 10/107,002, filed on Mar. 26, 2002, now Pat. No. 6,759,290.

(60) Provisional application No. 60/278,622, filed on Mar. 26, 2001.

(51) Int. Cl.
*H01L 21/336* (2006.01)

(52) U.S. Cl. .................. 438/257; 365/185.02

(58) Field of Classification Search ............... 257/219, 257/225, 412, 581; 365/185.02, 185.08, 365/185.27, 185.28, 185.29
See application file for complete search history.

(56) References Cited

U.S. PATENT DOCUMENTS

| | | | |
|---|---|---|---|
| 5,459,355 A | 10/1995 | Kreifels | 257/758 |
| 5,933,725 A | 8/1999 | Kirsch et al. | 438/239 |
| 5,973,953 A | 10/1999 | Yamashita et al. | 365/63 |
| 6,177,318 B1 | 1/2001 | Ogura et al. | 438/267 |
| 6,248,633 B1 | 6/2001 | Ogura et al. | 438/267 |
| 6,255,166 B1 | 7/2001 | Ogura et al. | 438/257 |
| 6,477,088 B1 | 11/2002 | Ogura et al. | 365/185.29 |
| 6,828,233 B1 * | 12/2004 | Leiphart | 438/648 |

FOREIGN PATENT DOCUMENTS

| | | |
|---|---|---|
| DE | 19824209 A1 | 5/1998 |
| EP | 0487468 A2 | 11/1991 |
| EP | 0871221 A1 | 11/1997 |

\* cited by examiner

*Primary Examiner*—Phuc T. Dang
(74) *Attorney, Agent, or Firm*—Saile Ackerman LLC; Stephen B. Ackerman; Rosemary L. S. Like

(57) ABSTRACT

In this invention, by offering specific array-end structures and their fabrication method, the three resistive layers of diffusion bit line, control gate and word gate polysilicons, where control gate polysilicon can run on top of the diffusion bit line, are most effectively stitched with only three layers of metal lines keeping minimum metal pitches. The stitching method can also incorporate a bit diffusion select transistor and/or a control gate line select transistor. The purpose of the select transistors may be to reduce the overall capacitance of the bit line or control gate line, or to limit the disturb conditions that a grouped sub-array of cells may be subjected to during program and/or erase.

32 Claims, 22 Drawing Sheets

STITCH AND SELECT IMPLEMENTATION IN TWIN MONOS ARRAY

RELATED PATENT APPLICATION

This is a division of patent application Ser. No. 10/107,002, filing date Mar. 26, 2002, now U.S. Pat. No. 6,759,290 which claims the benefit of priority to U.S. Provisional Application 60/278,622, filing date Mar. 26, 2001, Stitch And Select Implementation In Twin Monos Array, assigned to the same assignee as the present invention.

U.S. patent application Ser. No. 09/810,122 filed on Mar. 19, 2001, now U.S. Pat. No. 6,759,290 assigned to the same assignee as the present invention.

BACKGROUND OF THE INVENTION

1) Field of Invention

The invention relates to stitching (strapping) methods of forming high-density Metal/polysilicon Oxide Nitride Oxide Silicon (MONOS) memory arrays with reduced bit line resistance, reduced control gate resistance and reduced word gate resistance using three-level metal lines, resulting in high density MONOS memory arrays with high performance.

2) Description of Prior Art and Background

Twin MONOS structures were introduced in the U.S. Pat. No. 6,255,166, and U.S. patent application Ser. Nos. 09/861,489 and 09/595,059 by Seiki Ogura et al. and also various array fabrication methods of the twin MONOS memory array were introduced in U.S. Pat. Nos. 6,177,318 and 6,248,633 B1 and U.S. patent application Ser. No. 09/994,084 filed on Nov. 21, 2001.

The twin ballistic MONOS memory cell, illustrated in FIG. 1A, may be arranged into a bit diffusion array as follows: each memory cell contains two nitride regions 031 which comprise storage elements for one word gate 040, and half a source diffusion and half a bit diffusion (003). The diffusion junctions are shared by two adjacent storage elements. Control gates can be defined separately (042) or shared together (043) over the same diffusion (003). The control gate is electrically isolated from the underlying diffusion junctions. Diffusions are shared between cells and run in parallel to the sidewall control gates (042), and perpendicular to the word line (041). The diffusion lines become bit lines.

In a conventional MOSFET memory, a transistor structure consisting of one polysilicon gate between source and drain diffusions is used and word gate polysilicon line and diffusion bit lines are orthogonally placed. When the memory array gets large, the bit line (BL) and word gate line (WG) become long. The word line resistance due to the series of word gates is high in large memory devices. In order to reduce word line resistance, it is necessary to connect the word line periodically to a metal line that runs in parallel to the poly word lines. This is referred to as a "stitched" or "strapped" word line. Also the bit diffusion line can be sub-arrayed and the bit line can be "stitched" by a conductive metal line. In a typical memory, each polysilicon word line is stitched to a metal word line which runs on top of each poly word line, and each diffusion line, which runs orthogonally to the word lines is stitched by another layer of metal line.

However, in the high-density twin MONOS cell shown in FIG. 1A, the transistor consists of three gates between source and drain diffusions. Three resistive layers of control gate and word gate and bit diffusion may need to be stitched to reduce resistance and to achieve the target performance. For higher density, the polysilicon control gate lines and diffusion bit lines may run in parallel to and on top of each other. If the cell is metal-pitch limited and requires stitching, that means that two additional layers, of metal lines have to run on top of and contact to the two resistive layers. This is a layout and process challenge, as it is not possible to stitch two resistive layers to two respective metal layers when the set of the composite four lines are running on top of each other within the minimum metal pitch.

SUMMARY OF THE INVENTION

In the memory cell described hereinabove, however, another third resistive layer is added and stitched by the third level metal. Then a clever three-dimensional solution makes it possible to stitch three resistive layers by three metal lines.

An objective of the present invention is to provide a new method of stitching between high resistance lines and low resistance metal lines in a memory cell having three types of high resistance lines.

Another objective of the present invention is to provide a new method of stitching such that the three high resistance lines can be stitched by three low resistance metal lines within a cell size that is limited by the minimum metal pitch.

Yet another objective of the present invention is to provide a method of forming the stitch contact areas for the high resistance line.

A further objective of the present invention is to provide a method of stitching three high resistance lines to low resistance metal lines while providing bit line select transistors.

A still further objective of the present invention is to provide a method of stitching three high resistance lines to low resistance metal lines while providing bit line and control gate select transistors.

In this invention, by offering specific array-end structures and their fabrication method, the three resistive layers of diffusion bit line, control gate and word gate polysilicons, where control gate polysilicon can run on top of the diffusion bit line, are most effectively stitched with only three layers of metal lines keeping minimum metal pitches.

When the memory becomes too large, the total capacitance of the bit line also becomes too large and the RC time constraint becomes too large for a specific application speed. Therefore, the bit line needs to be subdivided into several sections. Each section is selected by placing a select transistor at each end of the subdivided section. Thus, the total bit line capacitance is reduced to the sum of the global metal line capacitance and the selected section of devices. Also the above stitching invention is extended to the case of placing select transistors on the bit line. Also another stitching method for the deviated array structure provided in U.S. patent application Ser. No. 09/994,084 is also presented using a similar method. FIG. 2 provides a conceptual illustration of a memory cell array having control gate lines 142 and bit lines 103 running in parallel to each other, and the word gate line 140 perpendicular to both the control gate and bit lines. Word gate polysilicon lines are stitched to metal. The diffusion bit line is further divided into a sub-array by a bit line select transistor 196, which connects to a main bit line. The control gate polysilicon line is also divided into a sub-array by a control gate line select transistor 195, which connects to a main control gate.

The first embodiment of the invention provides a stitching method of three resistive layers to three conductive layers where two resistive layers (003,042) run on top of, and in parallel to each other, and the third resistive layer (040) runs orthogonally to the first two resistive layers (FIG. 3). The cell width and height allows for one conductive metal in both the vertical and horizontal directions. Each resistive layer is periodically contacted (stitched) by a respective upper conductive layer to reduce the total resistive layer resistance. In order to reduce resistance, the middle resistive layer 2 (042) is periodically connected to the conductive layer 061 (M1), which is above it. In order to make a connection between the bottom resistive layer 1 (003) and the uppermost conductive layer M3 (081), the second resistive layer 2 (042) is cut and separated in order to expose the bottom resistive layer 1 (003). Then a contact/via stack is built up from the bottom resistive layer 1 (003) to the top conductive layer 3 (M3) 081. The two ends of the second resistive layer 2 (042) are connected together by contacting to the second conductive layer M2 (071). This second conductive layer M2 (071) wire bypasses the contact/via stack by using the open space of the adjacent cell. This bypass path will hereafter be referred to as a "loop". Since this bypass loop of second conductive layer M2 (071) blocks contact to the bottom resistive layer 1 (061), the stitch is placed on every other set of composite lines. The unstitched lines may be stitched at another location, a short or far distance away. Thus by utilizing one extra conductive metal layer, two resistive layers can be stitched to two conductive layers, when all four layers run in parallel to and on top of one another. The extra second conductive layer M2 (071) is used only in the stitch area, and may otherwise be used in the other areas to stitch between the third resistive layer 3 (040), which runs orthogonally to the first and second resistive layers 1 (003) and 2 (042). For this explanation, in order to reduce the resistance of the resistive layers, conductive layer 1 (061) stitches to resistive layer 2 (042); conductive layer 2 (071) stitches to resistive layer 3 (040) and conductive layer 3 (081) stitches to resistive layer 1 (003). In the loop, conductive layer 2 (071) is used to bypass the contact stack and connects the cut edges of resistive layer 2 (042) together. However, it is also possible to exchange the function of conductive layer 1 (061) and conductive layer 2 (071), and stitch them to resistive layer 3 (040) and resistive layer 2 (042), respectively. Thus three resistive layers may be stitched by three conductive metal layers within minimum cell/metal pitch.

In the second embodiment, in a diffusion bit array of the twin MONOS memory where the memory device structure is fabricated as described in U.S. Pat. No. 6,248,633 B1, the bit diffusion contact for stitch 151 is formed. Then by utilizing the resistive to conductive layer stitching method which was described in the first embodiment scheme, the control gate polysilicon 143 is stitched with Metal 1 (161) and at the line edge, as shown in FIG 5B. In the array, metal 2 (M2) 171 is used to lower the resistance of the polysilicon word gate line. However, in the stitch area, as demonstrated in FIG. 5C, M2 172 is also used to connect the edges of the severed CG lines that are contacted to Metal 1 (M1) 161. The M2 line loops around the contact/via stack 151, which connects the diffusion bit line 103 to the parallel running Metal 3 181 in FIG. 5D. Since the loop of M2 171 blocks the bit line contact in the adjacent cell, the stitch region contacts alternate bit lines and alternate CG lines. The uncontacted set of lines may be stitched immediately below in a separate stitch area or at the other end of the sub array. It is also possible to interchange the functions of metal 1 and metal 2 for this array, such that metal 1 is used to contact to the word line and for the stitch loop, and metal 2 is used to stitch to and reduce the resistance of the control gate line.

In the third embodiment of this invention, the stitching method also incorporates a bit diffusion select transistor and/or a control gate line select transistor. The purpose of the select transistors may be to reduce the overall capacitance of the bit line or control gate line, or to limit the disturb conditions that a grouped sub-array of cells may be subjected to during program and/or erase. These select transistors are added into the stitch areas between memory cell sub-arrays. FIG. 8A and FIG. 9C show an implementation example of a bit line select gate 211 and control gate select gate 212 in the stitch area. Referring to FIGS. 7A–E and 8A, the stitch areas on both sides of a sub-array are shown. Bit line select gates 211 are placed closest to the array and the control gate select gates 212 are placed outside of the bit line select gates from the array. At the end of the sub-array, the bit diffusion is extended past the edge of the control gate by implanting N+ species such as As prior to formation of control gate sidewalls (FIG. 9A). The bit diffusion extension 204 and bit select transistors 211 are provided alternatively on both sides of the sub-array. Select transistors are isolated from each other by shallow trench isolation. (FIG. 7E and FIG. 8A) The bit select gate 211 is placed horizontally across the extended bit diffusion and the horizontal gate becomes the bit select gate. The diffusion on the other side of the bit select transistor gate is connected to the main bit line by a contact stack 251 between the diffusion to second level metal 2 (271) as shown in FIG. 9A. When control gate select transistors 212 are also needed, a pair of control gate select transistors 212 are placed out of phase, and between the two bit line select transistors 211 inside the two edges of two sub-arrays. The pair of control gate select lines run parallel to the word gate and perpendicular to the bit line and control gate lines (FIG. 8A). The center contact 254 between two control gates 212 becomes the control gate connection point to the main control gate line which runs vertically in metal M3 (281), as illustrated in FIGS. 8A and 8D. The other diffusion region of the control gate select transistor is locally connected by metal M1 (261) to the other end of the polysilicon control gate stitch 252. (FIG. 8B) Main bit lines run in metal 2 (271), but near the main CG contact, they are cut and connected down to metal 1 (261), in order to loop around the main control gate contact 254 to complete the bit stitch (FIG. 8C). Thus at the one edge of sub-array space, alternative bit select gate/stitch via M2 line and control gate select/stitch via M3 may be completed using a M1-local connection and loop. Metal 1 may also be used in the array region to stitch the word gate lines at intervals to reduce the polysilicon word gate resistance. This example shows a bit select transistor and control gate select transistor. Using the same contact and metal wiring approach, it is also possible to implement the stitch and select area with transistors for only bit line selection or with transistors for only control gate line selection.

The fourth embodiment shows a stitching method in another type of array arrangement called "metal bit" where the diffusion of each cell is connected to first level metal (M1) 361 by a contact 351 (see FIG. 10C, FIG. 11B, and FIG. 12B). The polysilicon control gate lines 342 and the polysilicon word gate lines 340 run parallel to each other and orthogonally to the bit metal line 361 FIG. 12. A polysilicon pad is prepared in order to contact between the control gate polysilicon and metal (FIG. 10A–C). This polysilicon pad 343 is formed by using the self-aligned methods described in the previous embodiment. Metal M2 371 is used to stitch control gate 342 (FIG. 11C) and the metal M3 381 is used to stitch the word gate 340 (FIG. 11 D). The word gate contact 355 is placed in the open space which is created by cutting the control gate M2 line and looping around in metal 1 in order to avoid the word gate contact area (FIG. 11 C). By shifting the metal 2 and metal 3 lines half a metal pitch and looping with M2, as well as M1, every control gate line 342 and every other word gate line 340 can be contacted within the same region (FIG. 12A). Since the control gate line is a narrow sidewall polysilicon with higher resistance than the word gate line, the ability to stitch to every CG line on both ends of the sub-array is beneficial for high performance applications.

BRIEF DESCRIPTION OF THE DRAWINGS

In the accompanying drawings forming a material part of this description, there is shown.

DESCRIPTION OF THE PREFERRED EMBODIMENTS

Figure 3:
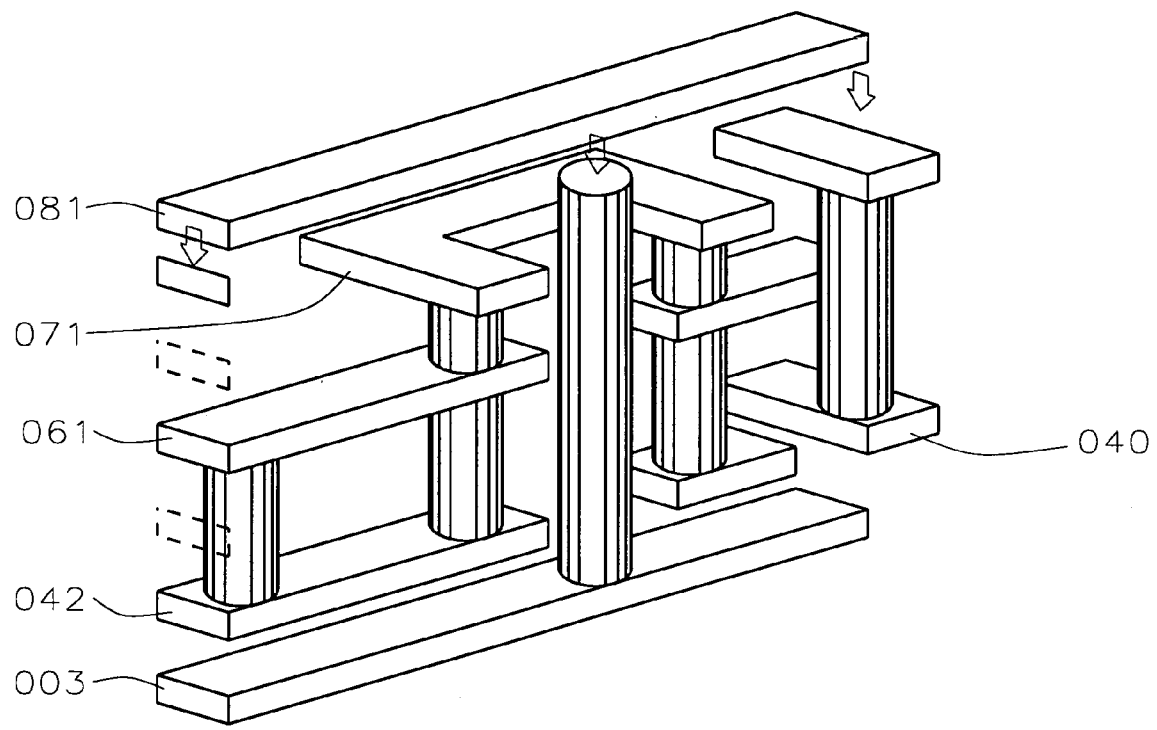
FIG. 3 is a three dimensional view of stitching three resistive layers by three conductive lines in a minimum pitch, according to the first embodiment of the present invention.

The first embodiment of the present invention provides a stitching method of three resistive layers to three conductive layers where two resistive layers (003,042) run on top of, and in parallel to each other, and the third resistive layer (040) runs orthogonally to the first two resistive layers (FIG. 3). The cell width and height allows for one conductive metal in both the vertical and horizontal directions. Each resistive layer is periodically contacted (stitched) by a respective upper conductive layer to reduce the total resistive layer resistance. In order to reduce resistance, the middle resistive layer 2 (042) is periodically connected to the conductive layer 061 (M1), which is above it. In order to make a connection between the bottom resistive layer 1 (003) and the uppermost conductive layer M3 (081), the second resistive layer 2 (042) is cut and separated in order to expose the bottom resistive layer 1 (003). Then a contact/via stack is built up from the bottom resistive layer 1 (003) to the top conductive layer 3 (M3) 081. The two ends of the second resistive layer 2 (042) are connected together by contacting to the second conductive layer M2 (071). This second conductive layer M2 (071) wire bypasses the contact/via stack by using the open space of the adjacent cell. This bypass path will hereafter be referred to as a "loop". Since this bypass loop of second conductive layer M2 (071) blocks contact to the bottom resistive layer 1 (003), the stitch is placed on every other set of composite lines. The unstitched lines may be stitched at another location, a short or far distance away. Thus by utilizing one extra conductive metal layer, two resistive layers can be stitched to two conductive layers, when all four layers run in parallel to and on top of one another. The extra second conductive layer M2 (071) is used only in the stitch area, and may otherwise be used in the other areas to stitch between the third resistive layer 3 (040), which is runs orthogonally to the first and second resistive layers 1 (003) and 2 (042). For this explanation, in order to reduce the resistance of the resistive layers, conductive layer 1 (061) stitches to resistive layer 2 (042); conductive layer 2 (071) stitches to resistive layer 3

(040) and conductive layer 3 (081) stitches to resistive layer 1 (003). In the loop, conductive layer 2 (071) is used to bypass the contact stack and connects the cut edges of resistive layer 2 (042) together. However, it is also possible to exchange the function of conductive layer 1 (061) and conductive layer 2 (071), and stitch them to resistive layer 3 (040) and resistive layer 2 (042), respectively. Thus three resistive layers may be stitched by three conductive metal layers within minimum cell/metal pitch.

The second preferred embodiment of the present invention will be discussed with reference to FIGS. 4–6.

Figure 4A:
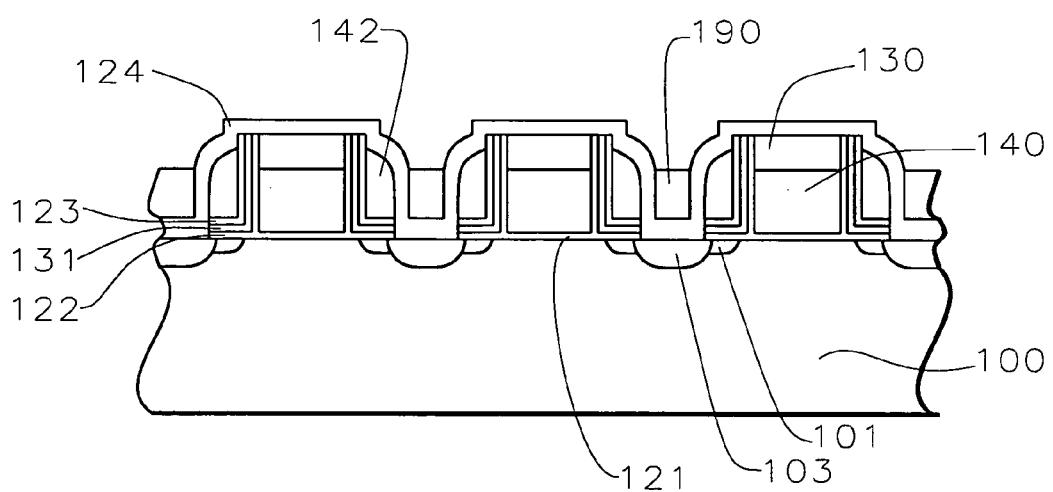
FIGS. 4A through 4C are cross sectional representations of unifying two sidewall gate devices into a single control gate and forming a bit contact area by etching out the unified control gate polysilicon, according to the second embodiment of the present invention.
Figure 4B:
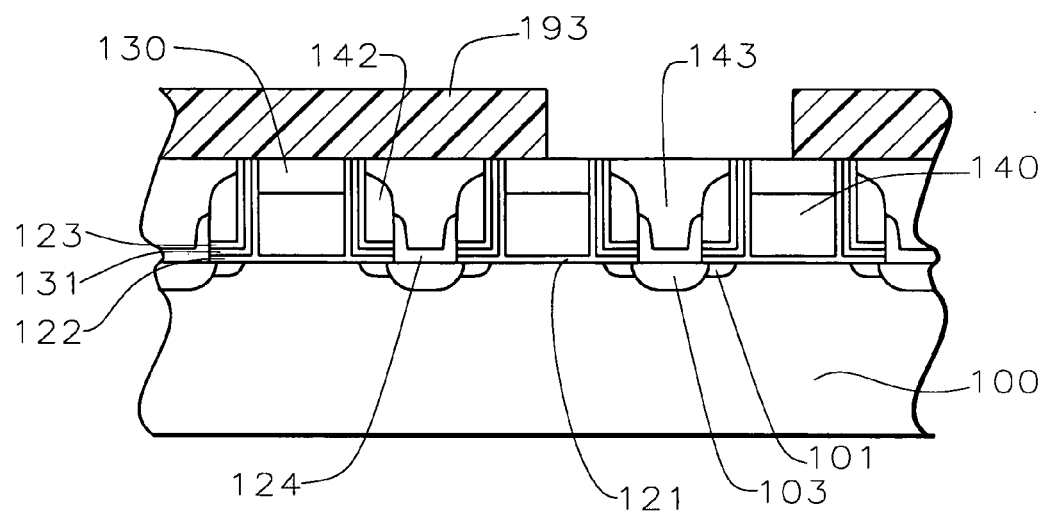

The ballistic twin MONOS memory cell is fabricated as taught in U.S. Pat. No. 6,248,633 B1. As illustrated in FIG. 4A, each memory cell contains two nitride regions 131 which comprise storage elements for one word gate 140, and half a source diffusion and half a bit diffusion (103). The diffusion junctions are shared by two adjacent storage elements. Control gates 142 are defined by vertical reactive ion etching on both word gate sidewalls. A pair of control gates 142 sharing the bit diffusion 103 may be connected together by plugging polysilicon 143 as shown FIG. 4B to reduce the resistance. After defining the sidewall gates 142, a silicon oxide film 124-A is grown or deposited over the control gates and the diffusion junctions 103 to form an isolation layer 124 in FIG. 4B. Using a recess mask 190 in FIG. 4A, the oxide 124-A is etched to leave the isolation oxide 124 in FIG. 4B. Then polysilicon in the canyon between separate control gates 142 is deposited and planarized. Unnecessary oxide 124-A over the polysilicon control gate is removed by wet or dry etching. A polysilicon is deposited to fill the space between the word lines and planarized by CMP to remove the polysilicon over the word gates as shown in FIG. 4B. The control gate 143 is electrically isolated from the underlying diffusion junctions 103. Diffusions run under the sidewall control gate 142, and perpendicular to the word line to be formed later overlying the control gate.

Figure 4C:
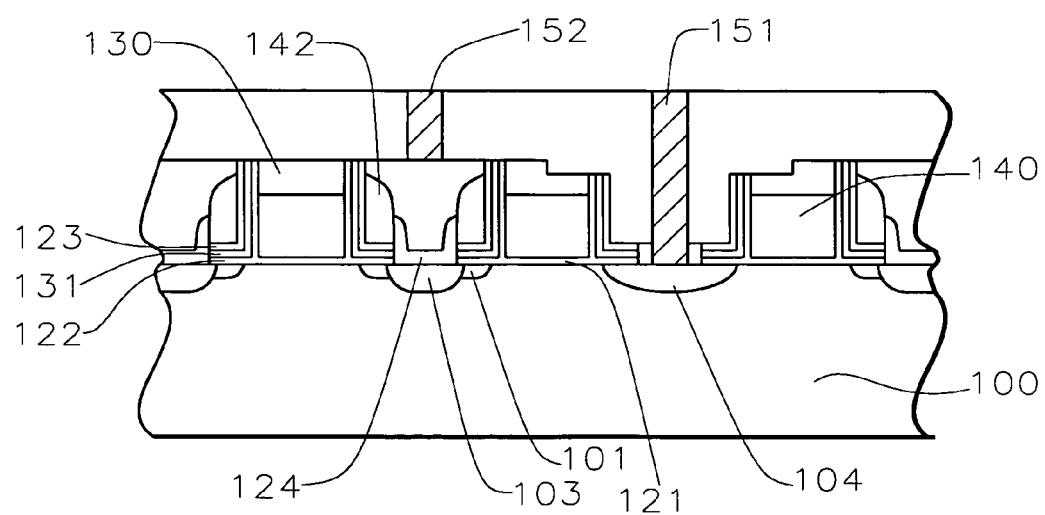

The bit diffusion area is exposed using photoresist mask 193, shown in FIG. 4B. The polysilicon 142 and 143 is selectively etched using, for example, a reactive ion etching (RIE) process having a chlorine base, followed by a bit contact ion implantation 104, such as As, as shown in FIG. 4C to form all n+ region profile under the ONO and make the contact area borderless with n+ dopant.

Figures 5A, 5B:
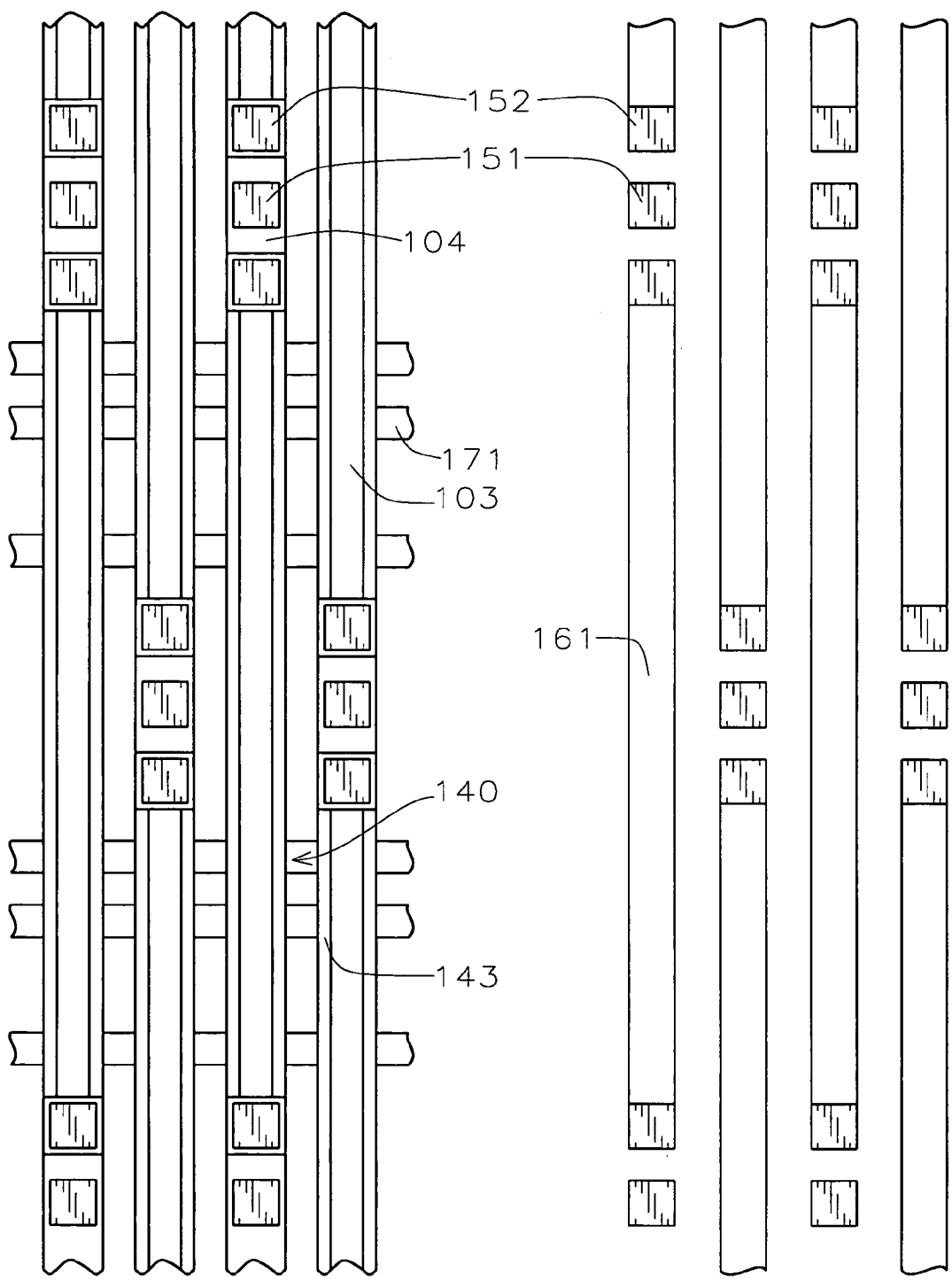
FIG. 5A is a top view of the memory array obtained by the process in FIGS. 4A–C.
FIG. 5B is a top view after processing metal 1 and via in FIG. 5A.
Figure 5C:
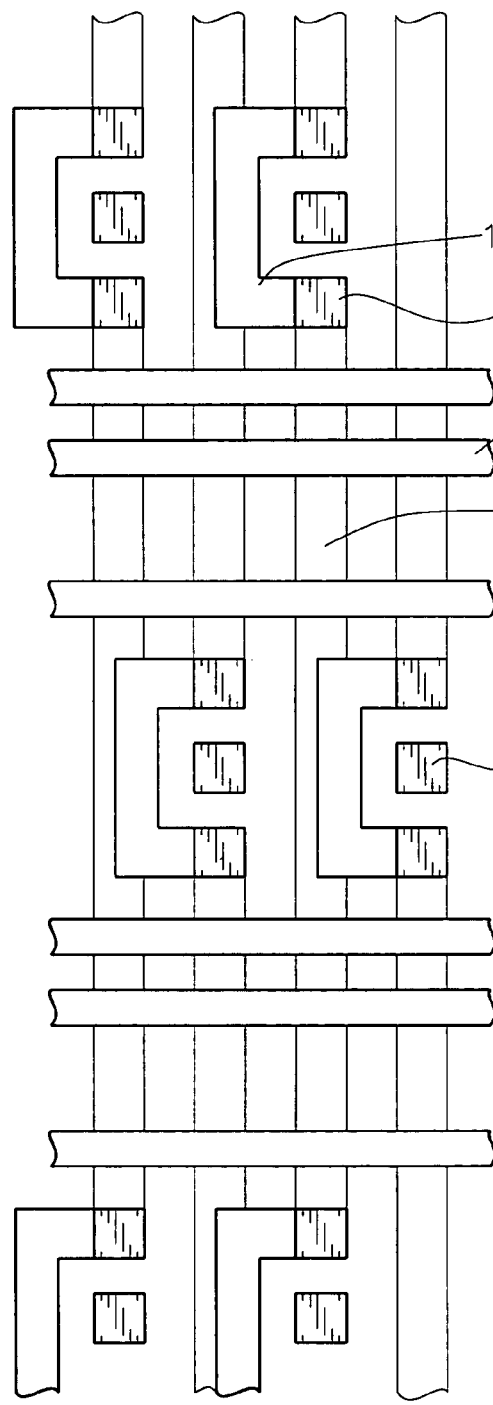
FIG. 5C is a top view after metal 2 formation in FIG. 5A.
Figure 5D:
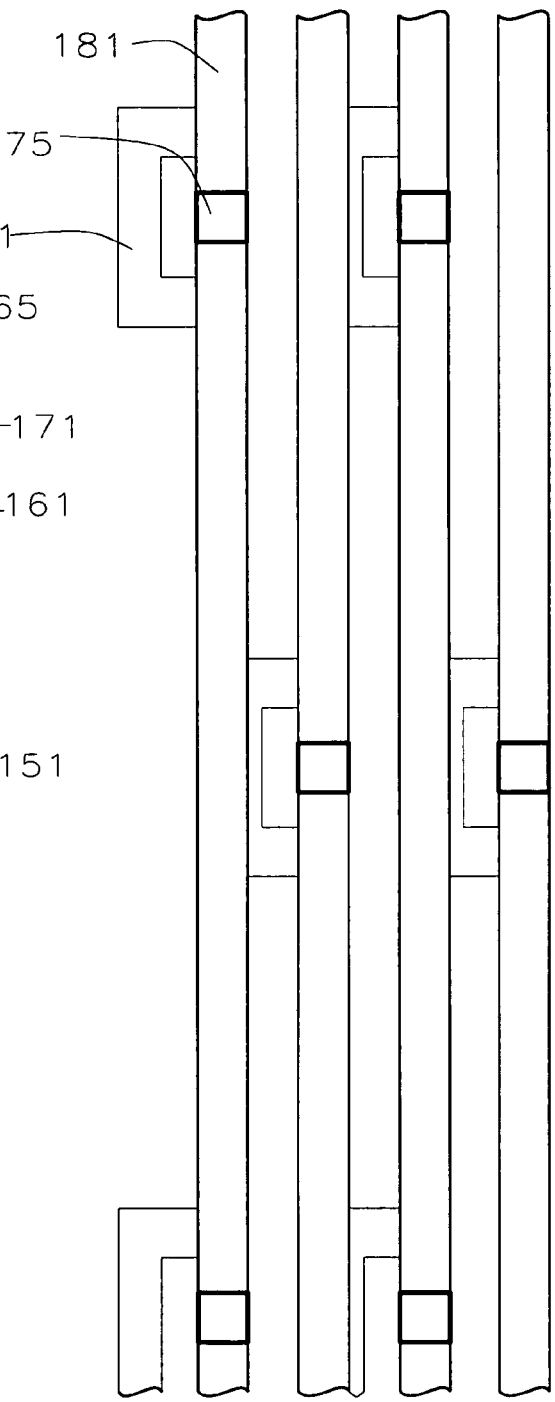
FIG. 5D is a top view after metal 3 formation in FIG. 5A.

A conventional metal contact process is followed; for example, oxide deposition within the opening, chemical mechanical polish (CMP) of the oxide, opening of a contact hole, tungsten fill, and CMP of the tungsten. FIG. 4C illustrates the completed bit diffusion stitch contact 151 and control gate contact 152. FIG. 5A shows a top view of the MONOS device at this point. FIG. 4C shows cross section B–B' of FIG. 6B. The stitch contact holes 152 and the bit contact hole 151 are placed on alternate bit lines and control gate lines. Control gate contacts placed on the both edges, as shown in FIG. 5A, connect together with $1^{st}$ metal 161 as shown in FIG. 5B, where the $1^{st}$ metal pads are placed on bit contacts to stack up. The via process follows to stack the bit contacts and control gate contacts. The $1^{st}$ metal lines are opened at both sides of a bit contact 151 to bypass with $2^{nd}$ metal loop 171 as shown in FIG. 5C. The word lines are also stitched by $2^{nd}$ metal, not shown. The bit contacts are stacked by $2^{nd}$ metal pads and $2^{nd}$ via holes and stitched by $3^{rd}$ metal as shown in FIG. 5D.

Figure 6A:
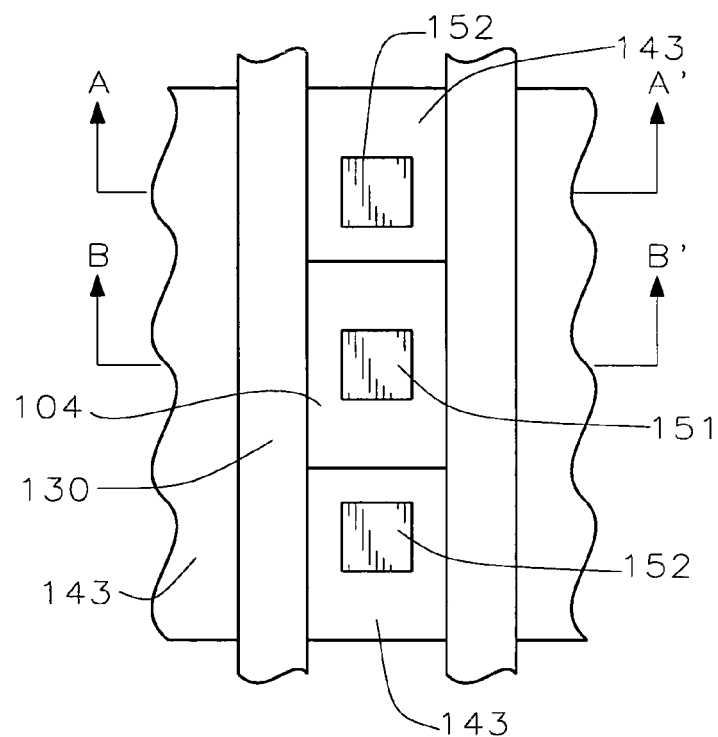
FIG. 6A is a magnified top view of the stitch area in FIG. 5A.
Figure 6B:
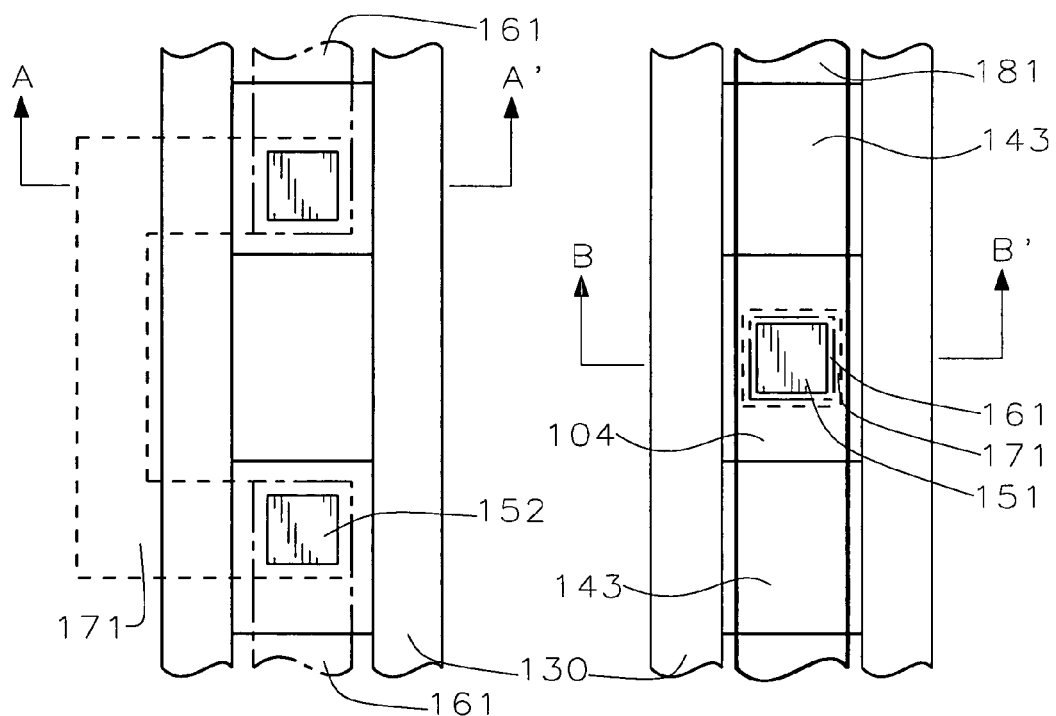
FIG. 6B is a magnified top view of both Control gate and Bit line connection at the stitch area of FIG. 6A.
Figure 6C:
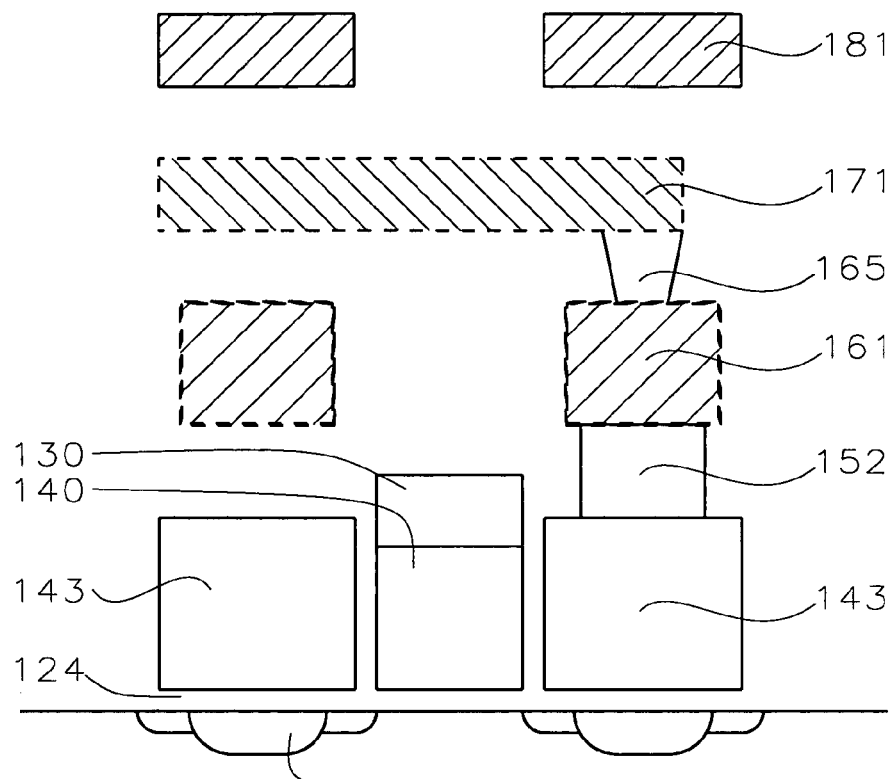
FIG. 6C is a cross sectional representation of the control gate stitch area after metal 3 formation showing cross section A–A' of FIG. 6B.
Figure 6D:
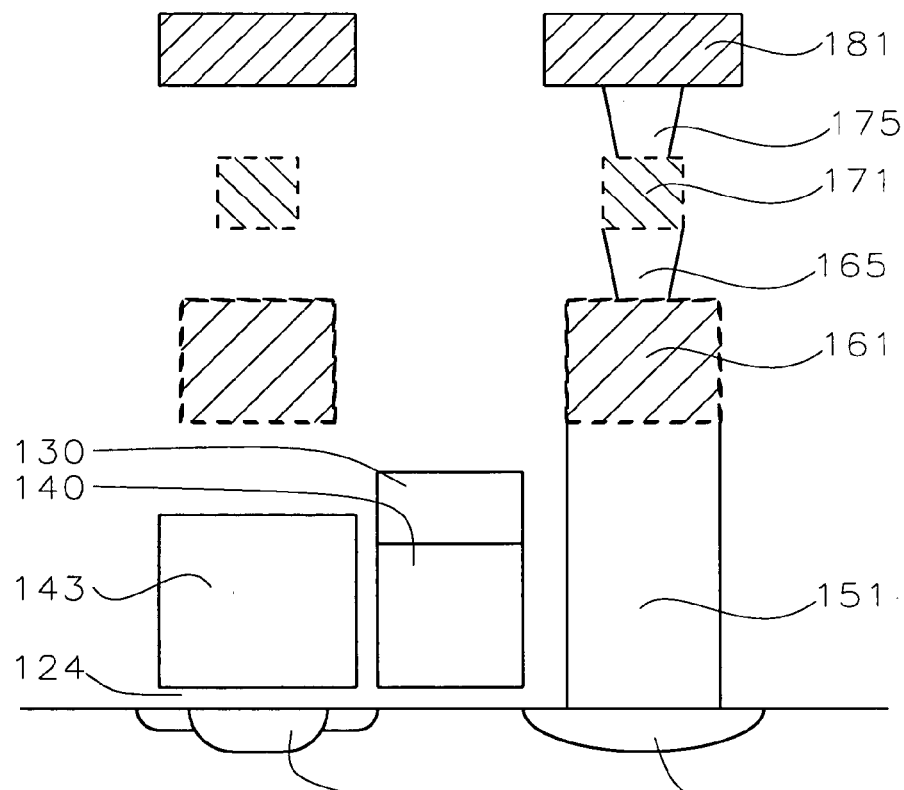
FIG. 6D is a cross sectional representation of the control gate stitch area after metal 3 formation showing cross section B–B' of FIG. 6B.
Figure 6E:
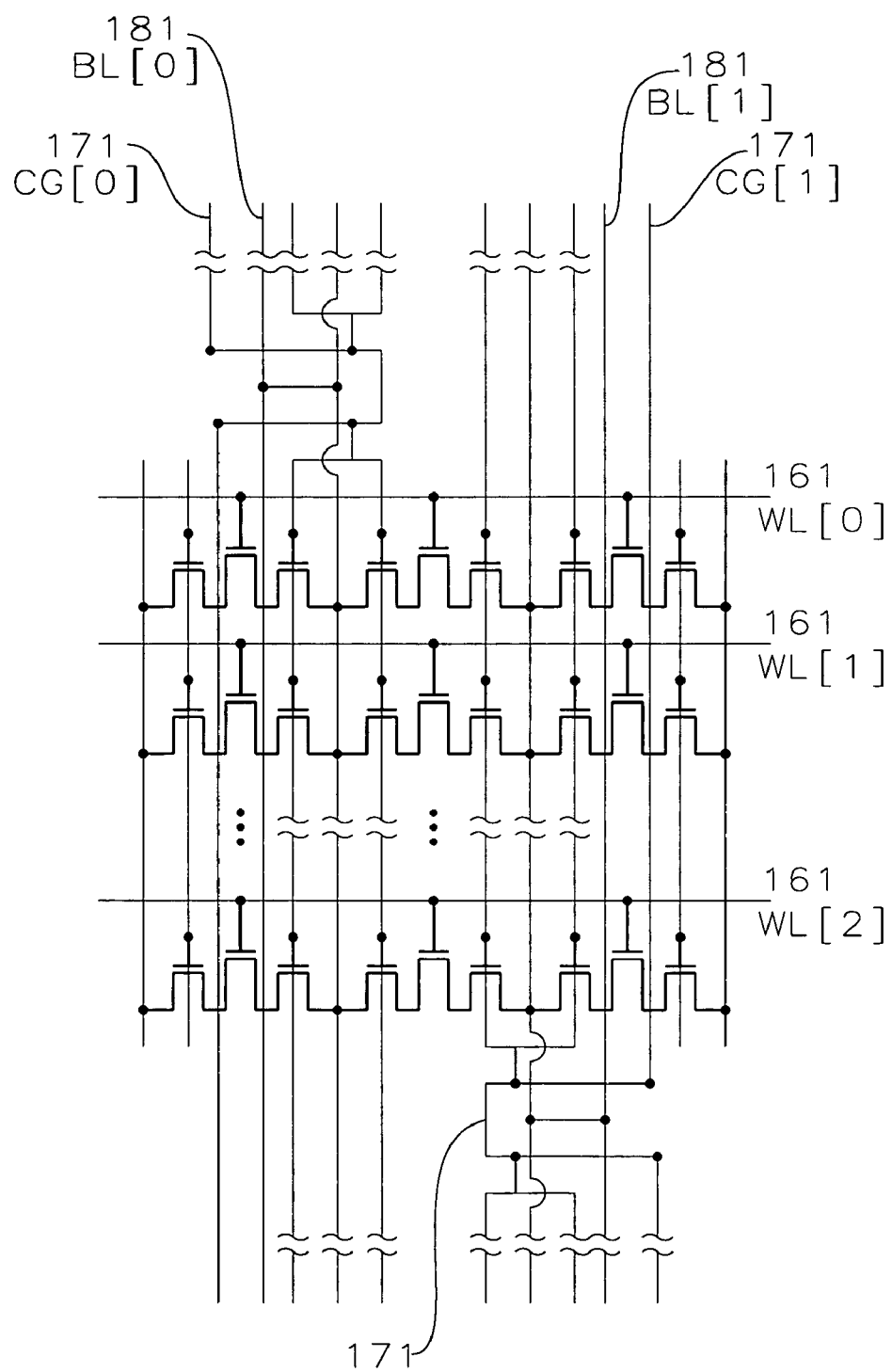
FIG. 6E is an equivalent circuit diagram of a sub-array with three level metal stitch.

FIG. 6A is a magnified top view of the stitch area in FIG. 5A. FIG. 6B is a magnified top view of both control gate and bit line connection at the stitch area of FIG. 6A. FIG. 6C is a cross sectional representation of the control gate stitch area after metal 3 formation showing cross section A–A' of FIG. 6B. FIG. 6D is a cross sectional representation of the control gate stitch area after metal 3 formation showing cross section B–B' of FIG. 6B. FIG. 6E is an equivalent circuit diagram of a sub-array with three level metal stitch.

In a minimum line space, a metal stitch is thus formed to the control gate using $1^{st}$ metal and $2^{nd}$ metal and bit line running immediately underneath the control gate 143 using $3^{rd}$ metal. A metal stitch to the word line is formed using the $2^{nd}$ metal.

The third embodiment of the present invention will be described with reference to FIGS. 7–9. The third embodiment completes the stitching method having select devices. The bit line and control gate capacitance reduction of the present invention is achieved by placing bit select gates and control select gates in a tight sub-array space in conjunction with the previous metal stitches. FIG. 8A illustrates a top view after defining the contact. The control gate contacts 252 are placed at the end of a sub-array. The bit diffusion select gates 211 are placed on both sides of the sub-array (FIG. 7E). The bit diffusion contacts 251 are placed on alternate side of the sub-array as shown in FIG. 8A. In the area of a pair of control gate select devices 212, three contacts 253, 254, 253 are placed as shown in FIG. 8A. The select gates define which sub-array is selected. The center contacts 254 are connected to the main control line. Both sides of contacts 253 are connected to the sub-array control gate. These bit line and control gate contacts are wired using 3 metal layers. Loop 262 and local connection 261 as $1^{st}$ metal, shown in FIG. 8B, main bit line 271 as $2^{nd}$ metal, shown in FIG. 8C, and main control line 281 as $3^{rd}$ metal, shown in FIG. 8D.

Figure 7A:
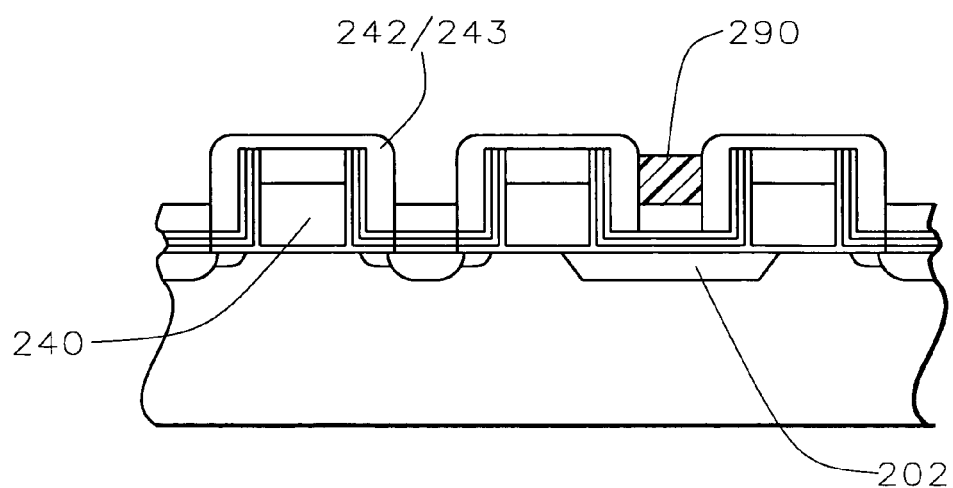
FIG. 7A through 7C are cross sectional representations of forming sidewall control gates and landing pads for control gate contacts, according to the third embodiment of the present invention.
Figure 7B:
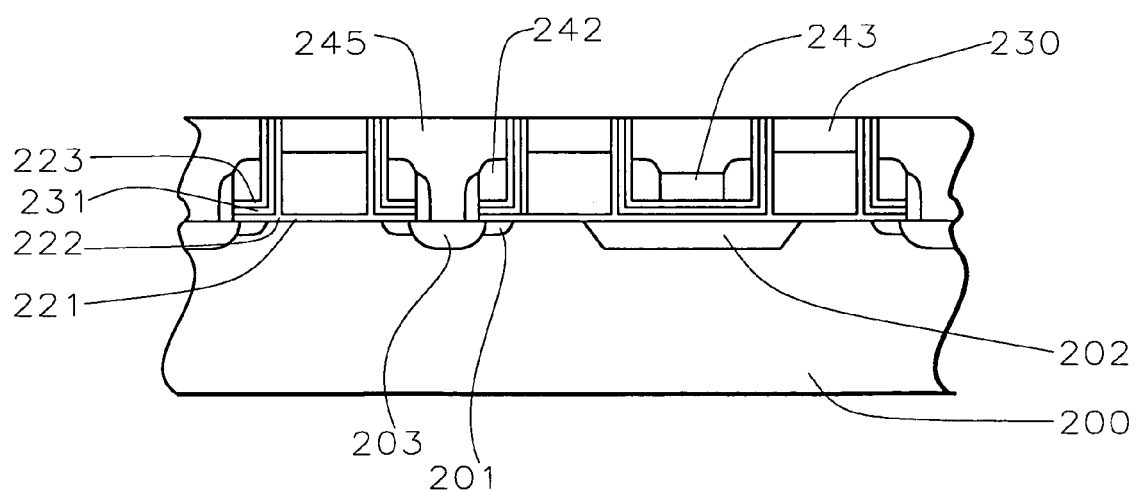
Figure 7C:
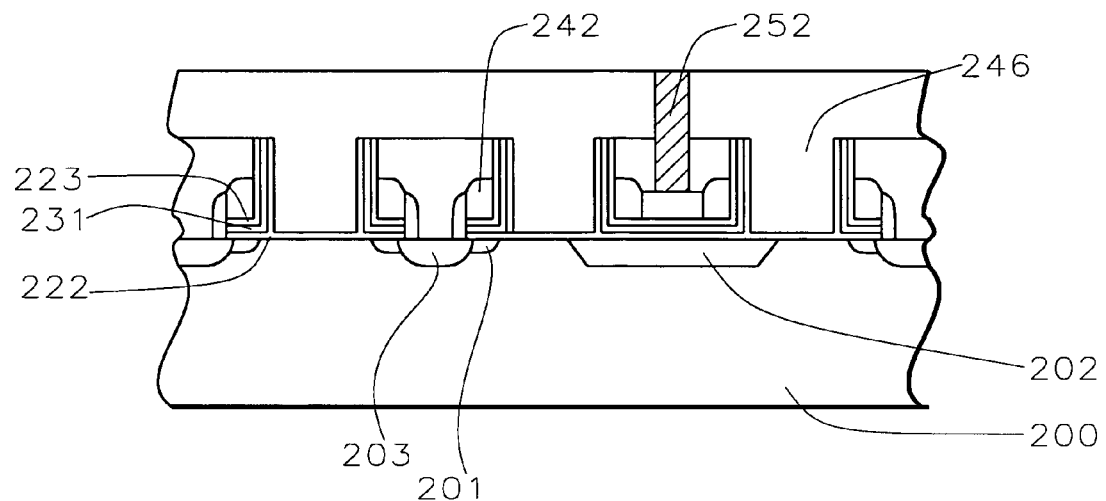
Figure 7D:
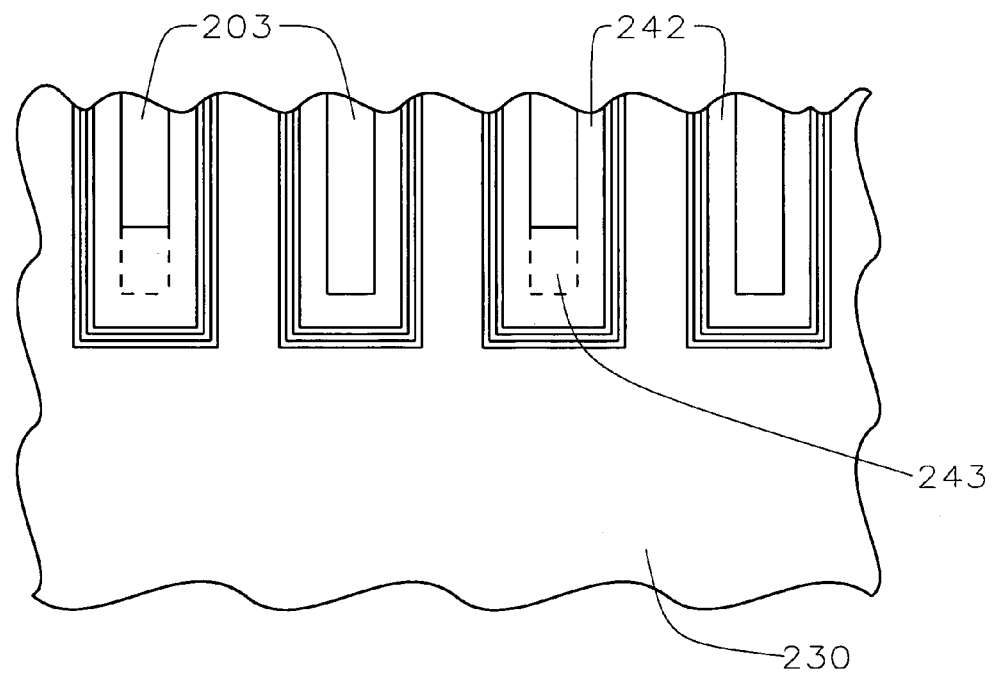
FIG. 7D is a top view of FIG. 7B.
Figure 7E:
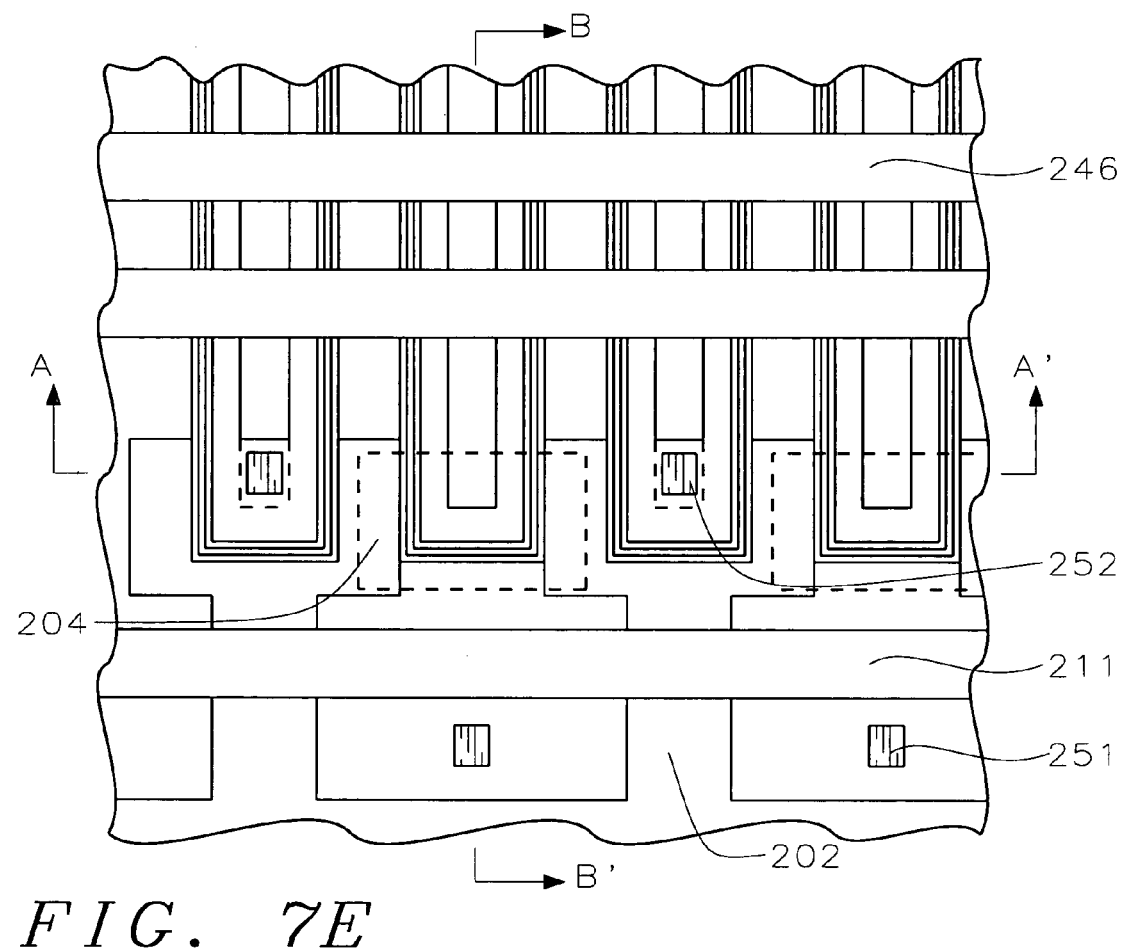
FIG. 7E is a top view after control gate completion in FIG. 7B and bit select gate formation. Bit diffusion N+ is extended passing under the control gate to select transistor.
Figures 8A, 8B:
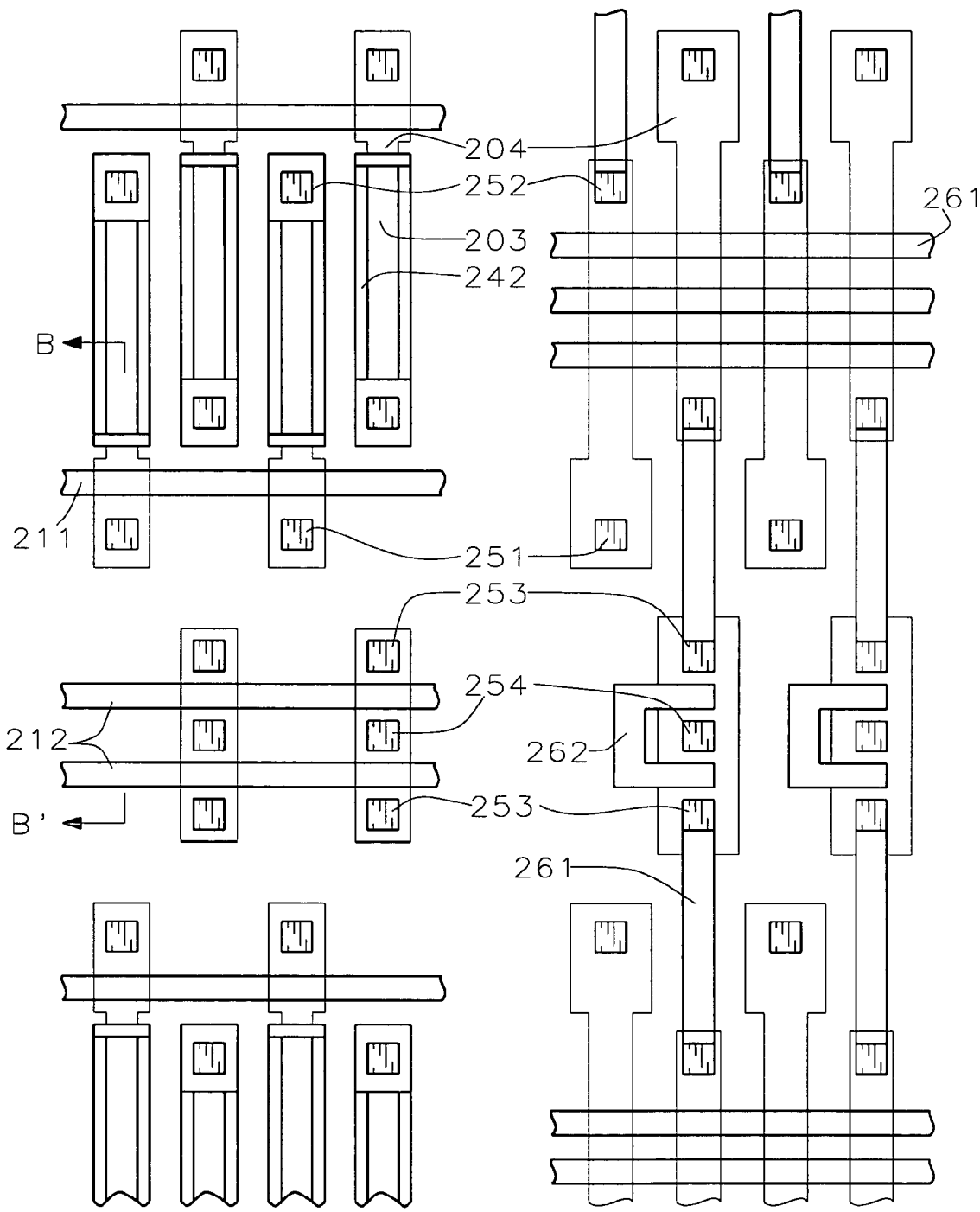
FIG. 8A is a top view of the stitching area with bit select and control select transistors prior to metal placement.
FIG. 8B is a top view after metal 1 wiring in FIG. 8A.
Figures 8C, 8D:
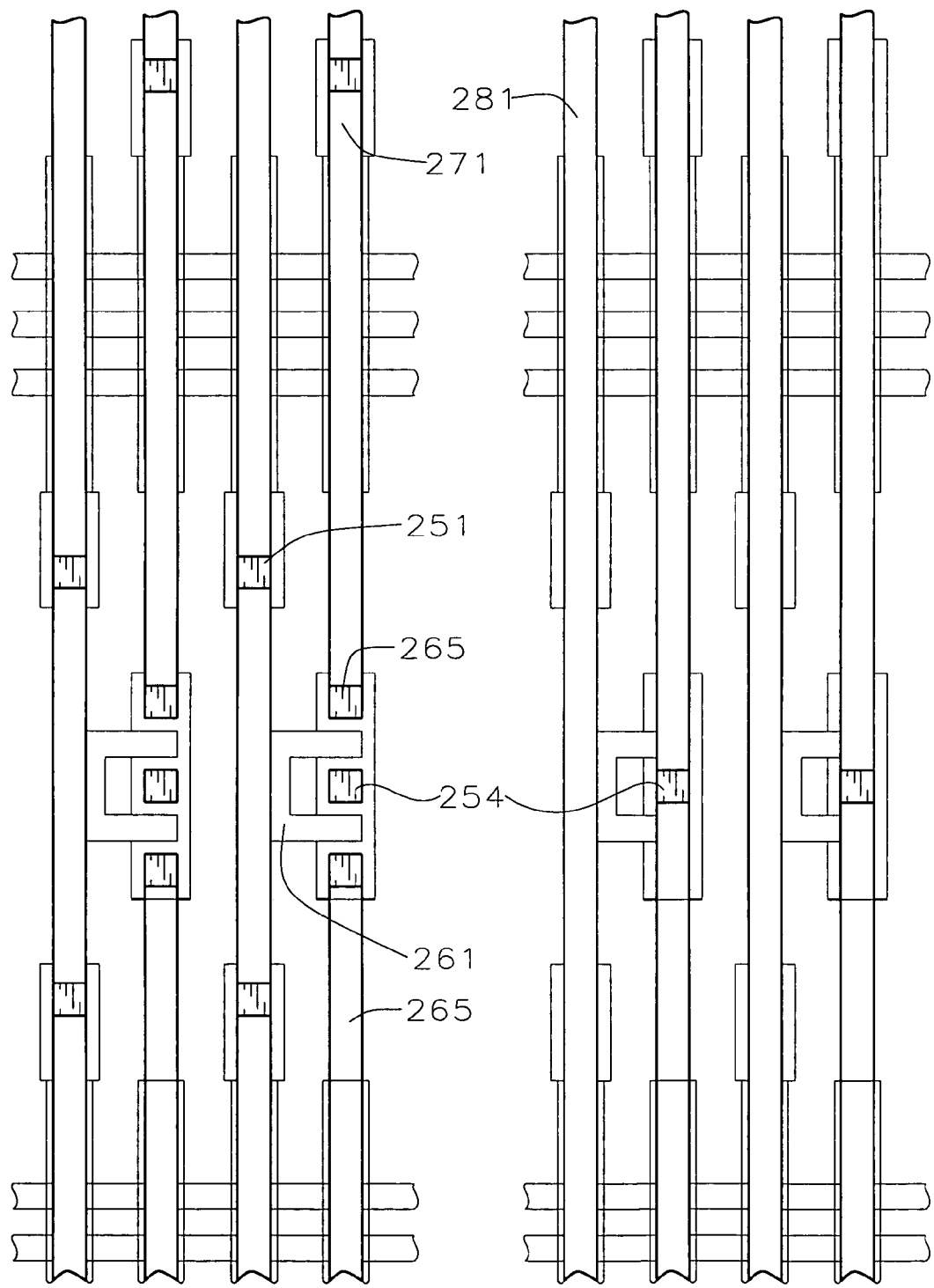
FIG. 8C is a top view after metal 2 Wiring in FIG. 8A.
FIG. 8D is a bird's view after metal 3 wiring in FIG. 8A.

FIGS. 7A, 7B and 7C illustrate cross-sections at various process steps to form control gates and their contacts. The conformal polysilicon layer 242/243 is deposited over the word gates 240, as shown in Fig.7A. In the process of the present invention, the control gate contact area 243 is placed over the shallow trench isolation (STI) region 202, where it is covered with recessed photoresist mask or hard mask 290. The mask is applied to expose the control gate polysilicon except in the control pad area. Then the vertical etch of the sidewall polysilicon is performed to get the sidewall control gates 242. Polysilicon overlying diffusions 203 is etched out. However, the polysilicon 243 over the STI region is covered with the recessed mask 290 and the filled poly silicon for the control gate contact pad remains as shown in Fig. 7B, whose top view is provided in Fig. 7D.

After defining the peripheral area including the select gates, oxide 245 is deposited to fill the areas between the word gates and planarized until the cap nitride 230 is exposed. The word line (wire) polysilicon 246 is deposited, following the cap nitride strip to allow self-alignment. The word wire is defined by the conventional lithography and subsequent RIE etching the deposited polysilicon 246 and the word gate polysilicon 240 all the way down to the word gate oxide. This is followed by the conventional contact process with a sequence of oxide fill, oxide CMP, contact open, tungsten deposition and Tungsten CMP to form control gate contact 252. FIG. 7E is a top view after the contact process. FIG. 7C is a cross section cutting along A–A' running on control gate contacts 252 in FIG. 7E.

Figure 9A:
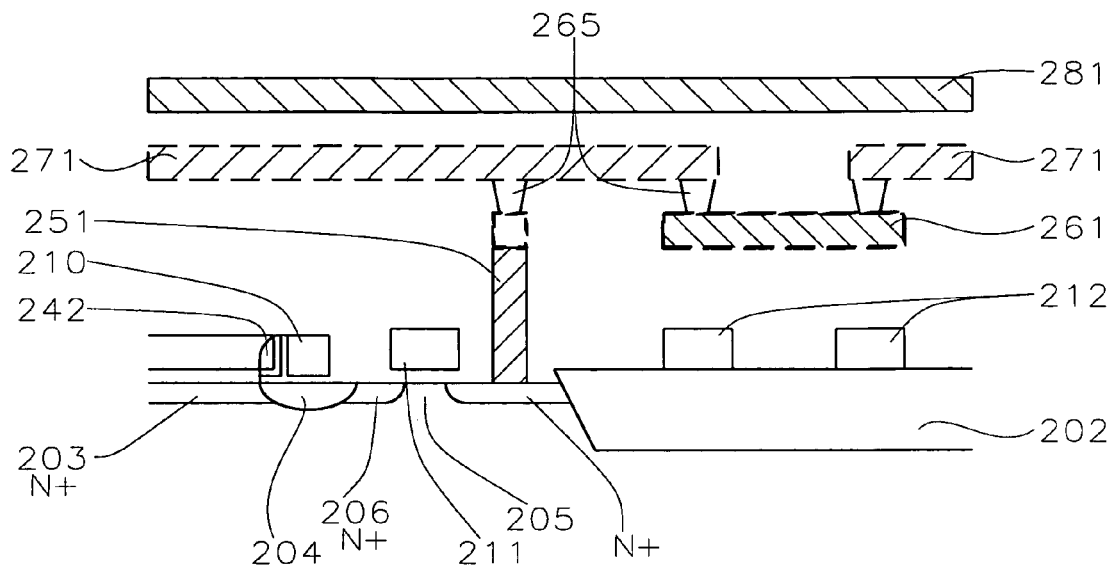
FIG. 9A is a cross-sectional representation of view B–B' of FIGS. 7E and 8A.

The extended diffusion 204 is defined in the N+ diffusion under the enclosing memory gate 210 by Arsenic ion implantation with a dose of between about 1E15 to 2E15 ions/cm$^3$ and an energy of between about 40 and 60 KeV immediately after STI formation to keep electrical continuity between the diffusion bit 204 and bit line select diffusion 206 (FIG. 9A)

This control select device 212 can be N-channel with isolated P-well from P-substrate or it can be a P-channel device with an independent N-well. When a P-channel device is used, the voltage application on the select gate 212 has to be chosen carefully to discharge near the low-ground level. The input voltage on the P-channel device is at least below the threshold voltage (Vt). If the p-threshold is −1.0V, then the select gate voltage for ON must be at least −1.0V instead of the normal 0V. However, this extra complexity with the negative voltage pays off in comparison with an N-channel select gate. In an N-channel select gate device, in order to pass high voltage Vcg(5~6V), the control select gate requires at least Vcg+Vt (at Vsub=Vcg), which means about 7~8 v on the select gate is required to pass 5.5V. Therefore, this extra high voltage requirement (almost 40% higher) forces the utilization of at least 40% thicker oxide for high voltage support devices. This extra oxide thickness can be avoided if the P-channel select device is chosen instead of the N-channel device.

The pair of control gate select lines run parallel to the word gate and perpendicular to the bit line and control gate lines in FIG. 8A. The center contact 254 between two control gates 212 becomes the control gate connection point to the main control gate line that runs vertically in metal M3 (281) FIG. 8A & 8D. The other diffusion region of the control gate select transistor is locally connected by metal M1 (261) to the other end the polysilicon control gate stitch 252. (FIG. 8B) Main bit lines run in metal 2 (271), but near the main CG contact, they are cut and connected down to metal 1 (261), in order to loop around the main control gate contact 254 to complete the bit stitch FIG. 8C. Thus at the one edge of the sub-array space, alternative bit select gate/stitch via M2 line and control gate select/stitch via M3 may be completed using a M1-local connection and loop. Metal 1 may also be used In the array region to stitch the word gate lines at intervals to reduce the polysilicon word gate resistance.

The application of the special wiring technique of the present invention in the twin MONOS cell device of U.S. Pat. No. 6,248,633 B1 is illustrated in FIG. 9C. The bit line signal BL[1] through the global Metal 2 is connected to one side of the bit select transistor (Bit Select 1) and the output is connected to the other side of the bit diffusion line which is connected to the drain of another bit select transistor (Bit Select 0). The source junction is connected to the BL[0] Metal 2 line. When one of the word lines in the block between two bit select transistors is selected, the bit signal from the BL[1] goes through the twin cells and reaches BL[0]. On the other hand, the control gate signal from CG[1] is dropped to the drain of the control gate transistor CG[1] and passes through the select transistor. Then the control gate signal is delivered to the control gate between two bit select transistors.

Figure 9B:
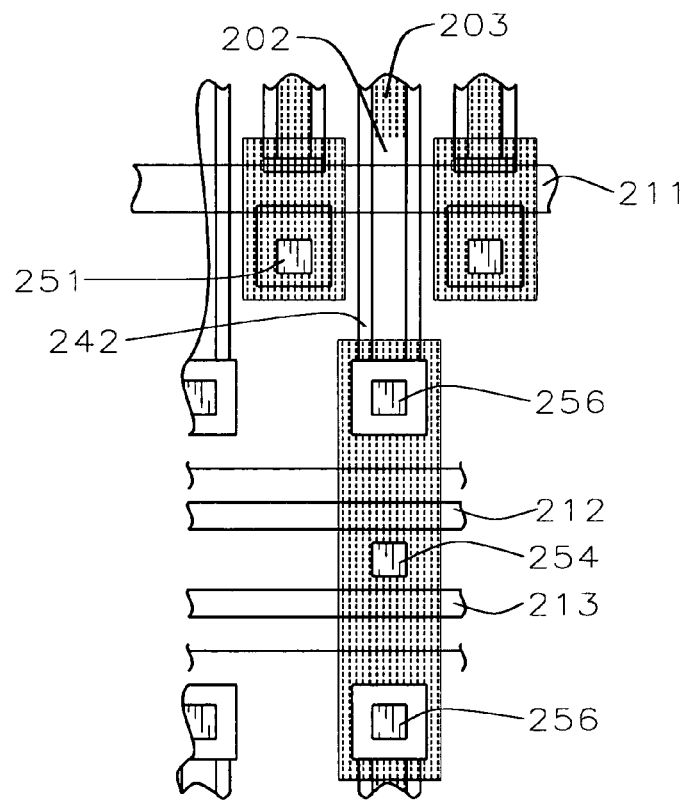
FIG. 9B is a top view of an alternative method of placing select devices.
Figure 9C:
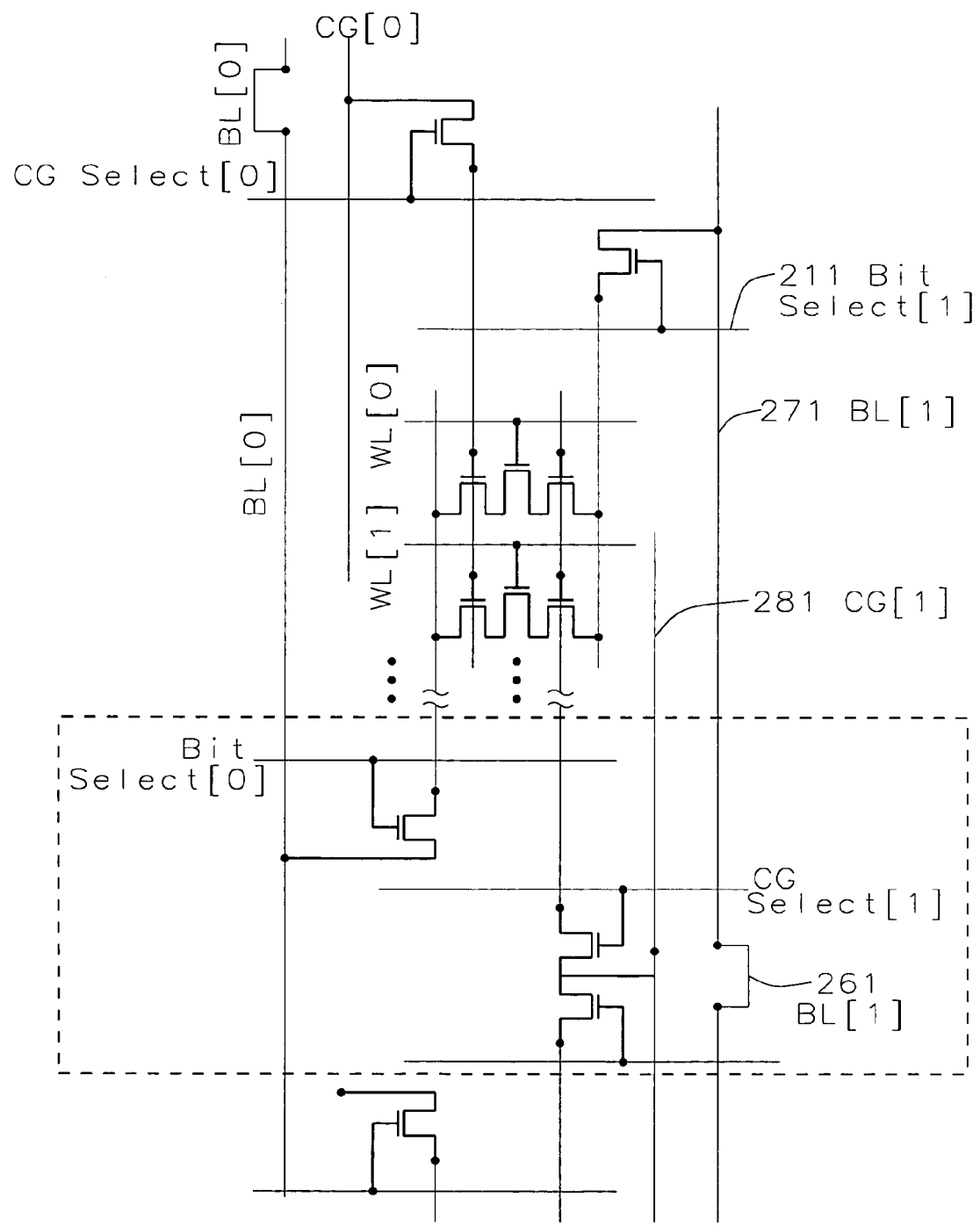
FIG. 9C is an equivalent circuit diagram according to the third embodiment of the present invention.

FIG. 9B shows an alternative method to place select devices with buried contacts 256 directly to the control gate. This reduces the stitch area since the direct contact eliminates $1^{st}$ metal local wire connecting a sub-array control gate and a select device source diffusion. The control gate is extended to the select device source diffusion. The contact 256 is connected to the underlying diffusion after removing the ONO. The control gate signal from the main control gate line 281 with $3^{rd}$ metal comes in through the stacked via 256 and is delivered to the source diffusion 256 when the select gate 213 is selected.

In the fourth preferred embodiment of the present invention, the stitching method of the invention can be used in the nonvolatile memory disclosed in the co-pending U.S. patent applications Ser. Nos. 09/810,122 and 09/994,084. This embodiment is discussed with reference to FIGS. 10–12.

Figure 10A:
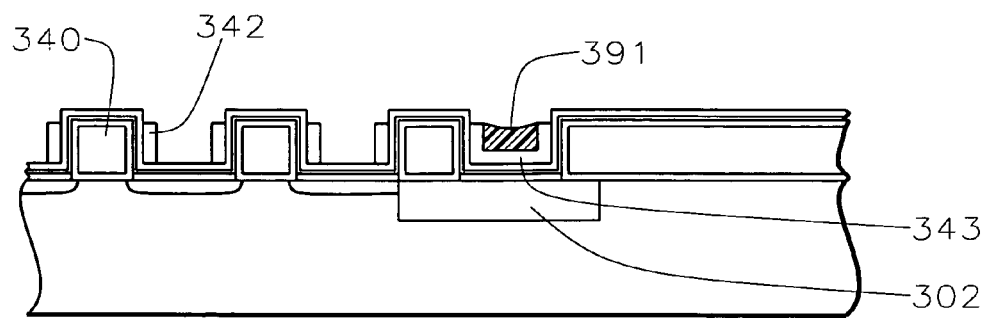
FIGS. 10A through 10C are cross sectional representations at various stages in forming twin MONOS device with a bit contact on each memory cell, according to the fourth embodiment of the present invention.
Figure 10B:
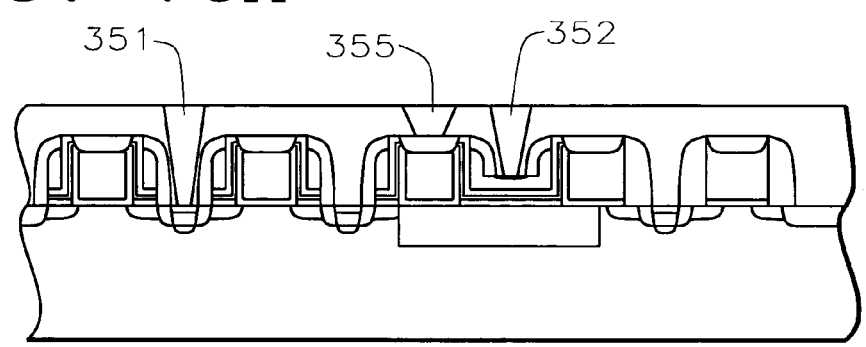

In another array arrangement of twin MONOS memory device, a stitching method of word gate and control gate to two metal lines running parallel is disclosed. In the process of the present invention, the control gate contact area 343 over the shallow trench isolation (STI) region 302 is covered with recessed photoresist or hard mask such as TEOS oxide. Then the vertical etch of the sidewall polysilicon is performed. Sidewall control gates 342 are left on the sidewalls of the word gate 340. However, the polysilicon 343 is protected by the recessed mask 391 as shown in FIG. 10A. A conventional CMOS gate definition follows to form the logic gate structure while protecting the memory area Then the sidewall dielectric spacer for logic gate follows as shown in FIG. 10B. The sidewall dielectric spacer on the logic gate can be a thin oxide and nitride spacer. Since the sidewall control gate can be thinner than 40 nm and the top of the control polysilicon gate can be reasonably lower than the top of the word gate polysilicon, the nitride spacer can cover the entire control gate polysilicon. During opening of the bit contact 351, the slight overlap of contact hole over the nitride layer is tolerable since the nitride has a lower etch rate during oxide RIE. A control gate contact 352 is made over the control gate contact polysilicon 343. Word line contacts 355 and Bit contacts 351 are also formed. The bit line is wired by $1^{st}$ metal 361 in FIGS. 10C and 11B, the control gate is stitched by $2^{nd}$ metal 371 in FIG. 11C, and the word line is stitched by $3^{rd}$ metal 381 in FIG. 11D.

Figure 1A:
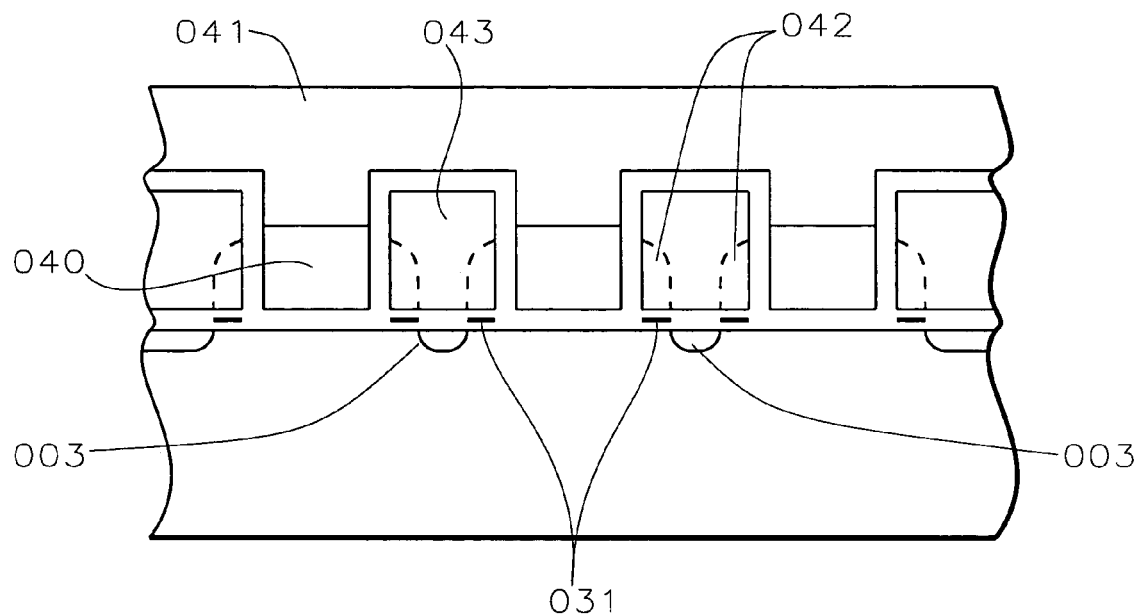
FIG. 1A is a cross sectional presentation of a twin MONOS memory device of the prior art.
Figure 1B:
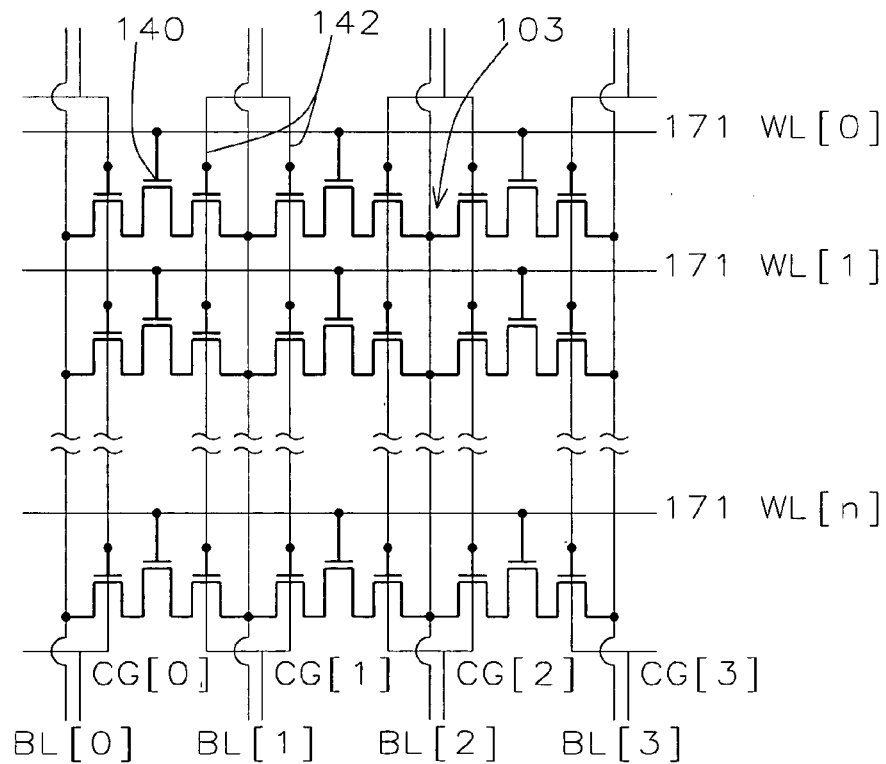
FIG. 1B is an equivalent circuit diagram of FIG. 1C
Figure 1C:
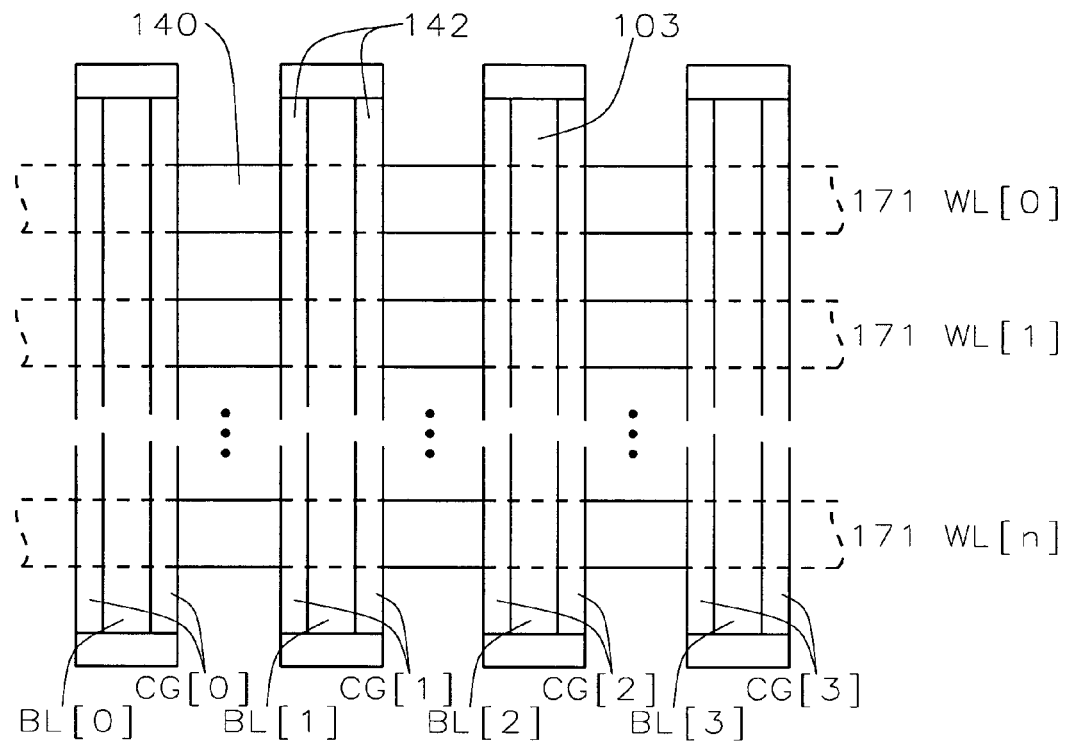
FIG. 1C is a top view of a twin MONOS array before formation of contact and metal wiring.
Figure 2:
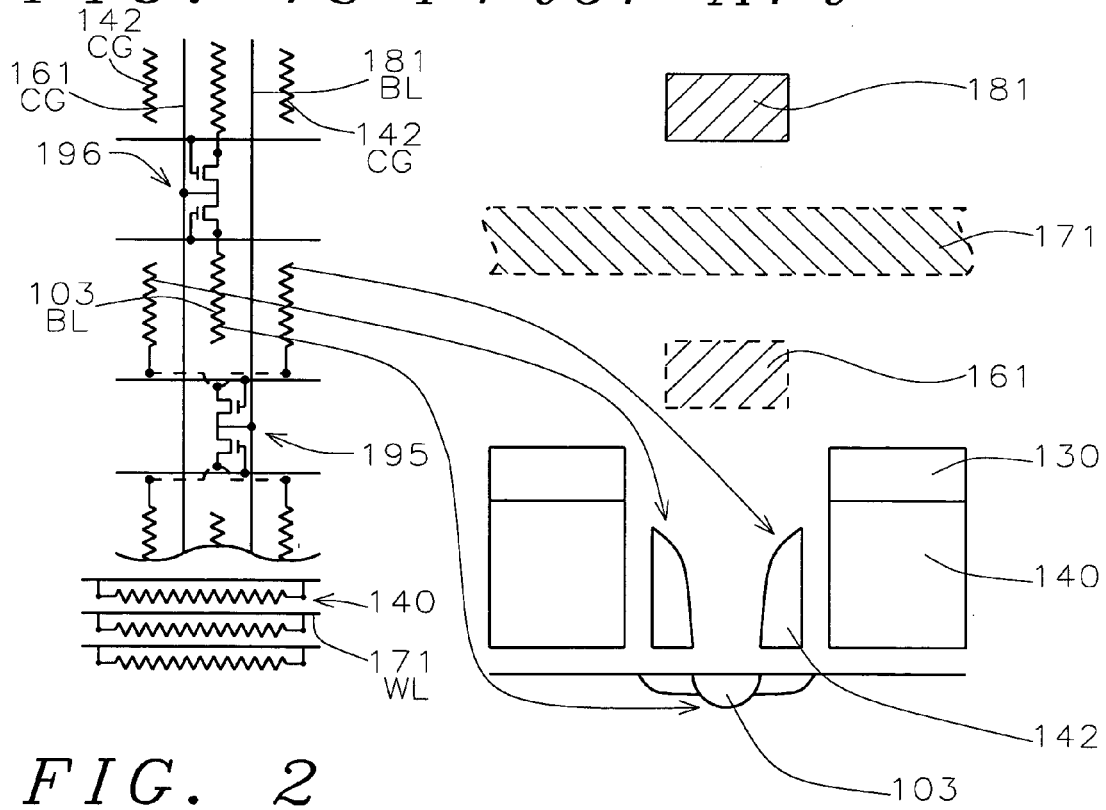
FIG. 2 is a conceptual illustration of stitching resistive word line by metal line 2 and placing bit and control gate select transistors to improve RC time constant as well as achieving stitching objective, according to the third embodiment of the present invention.
Figure 10C:
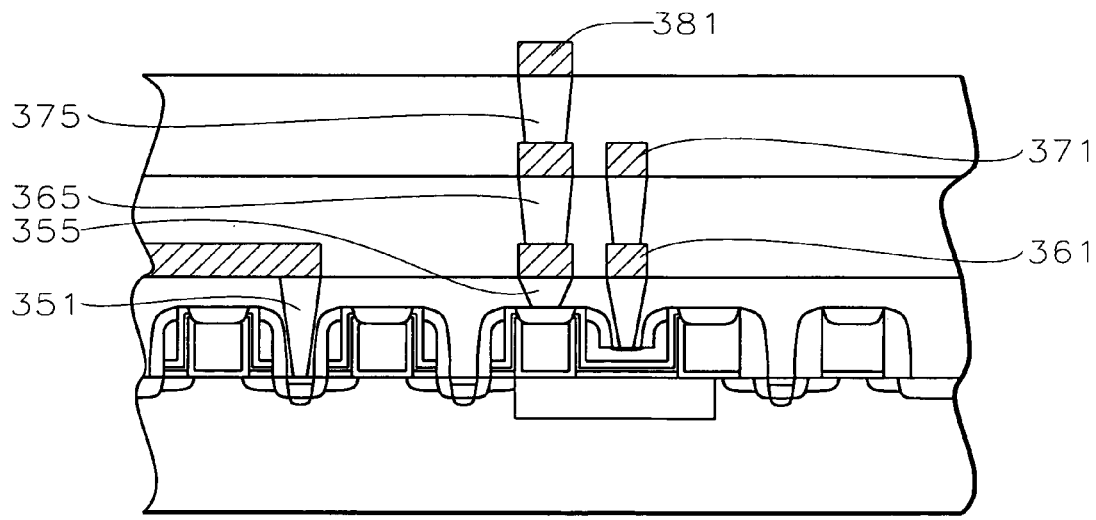
Figures 11A, 11B:
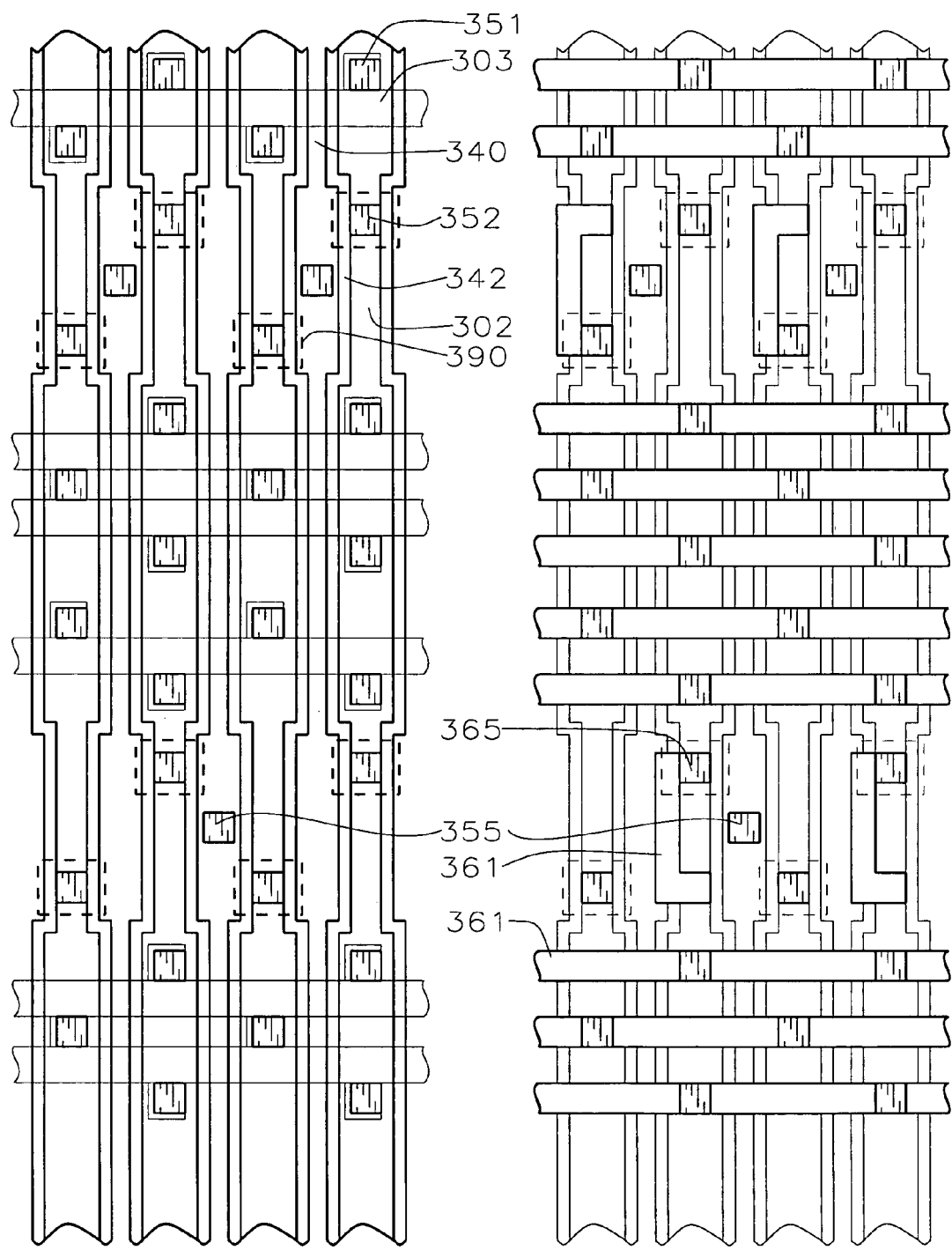
FIG. 11A is a top view just before Metal 1 wiring in FIG. 10C.
FIG. 11B is a top view just after Metal 1 wiring in FIG. 11C.
Figures 11C, 11D:
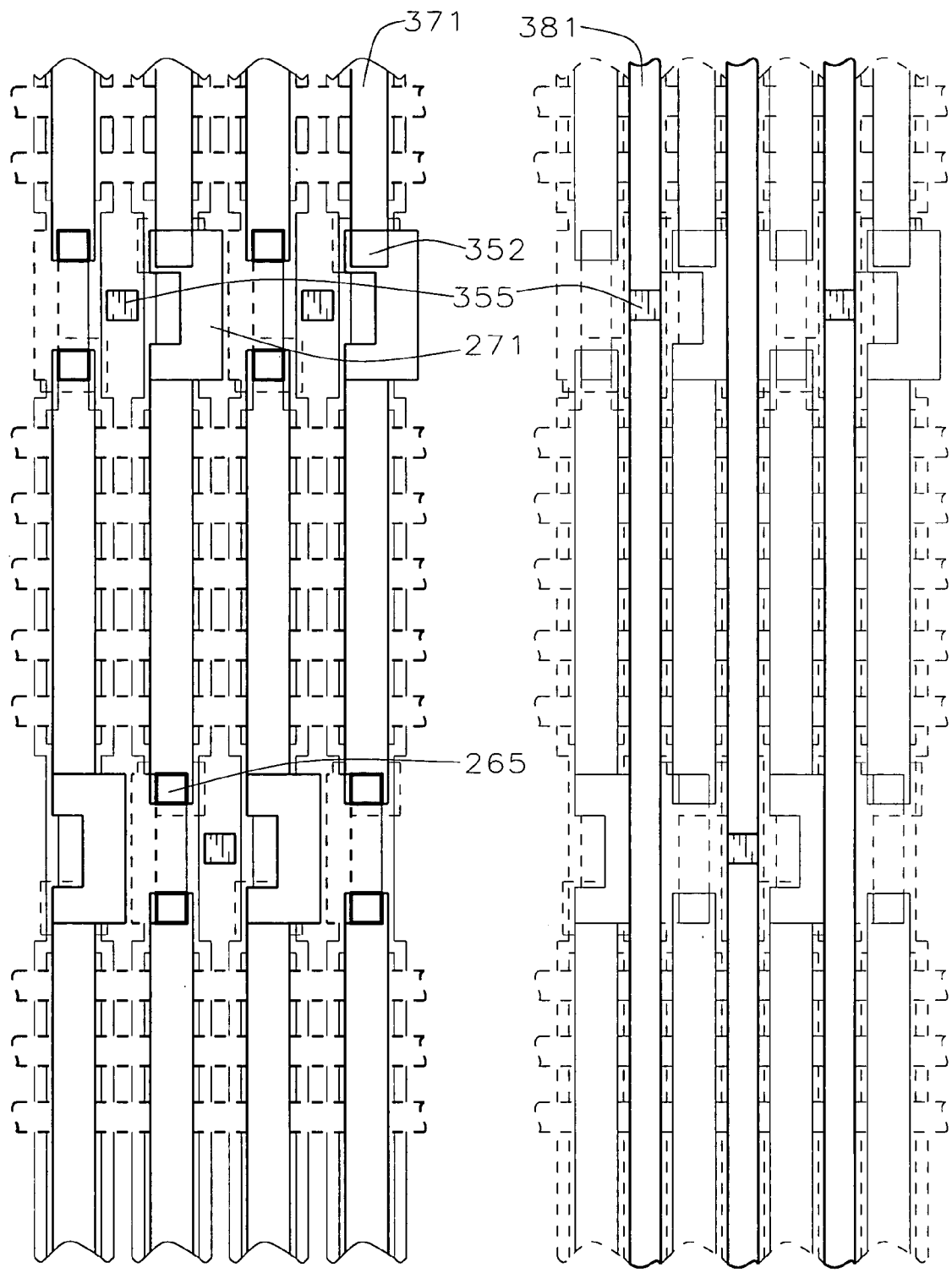
FIG. 11C is a top view just after Metal 2 wiring in FIG. 10C.
FIG. 11D is a top view just after Metal 3 wiring in FIG. 10C.
Figure 12A:
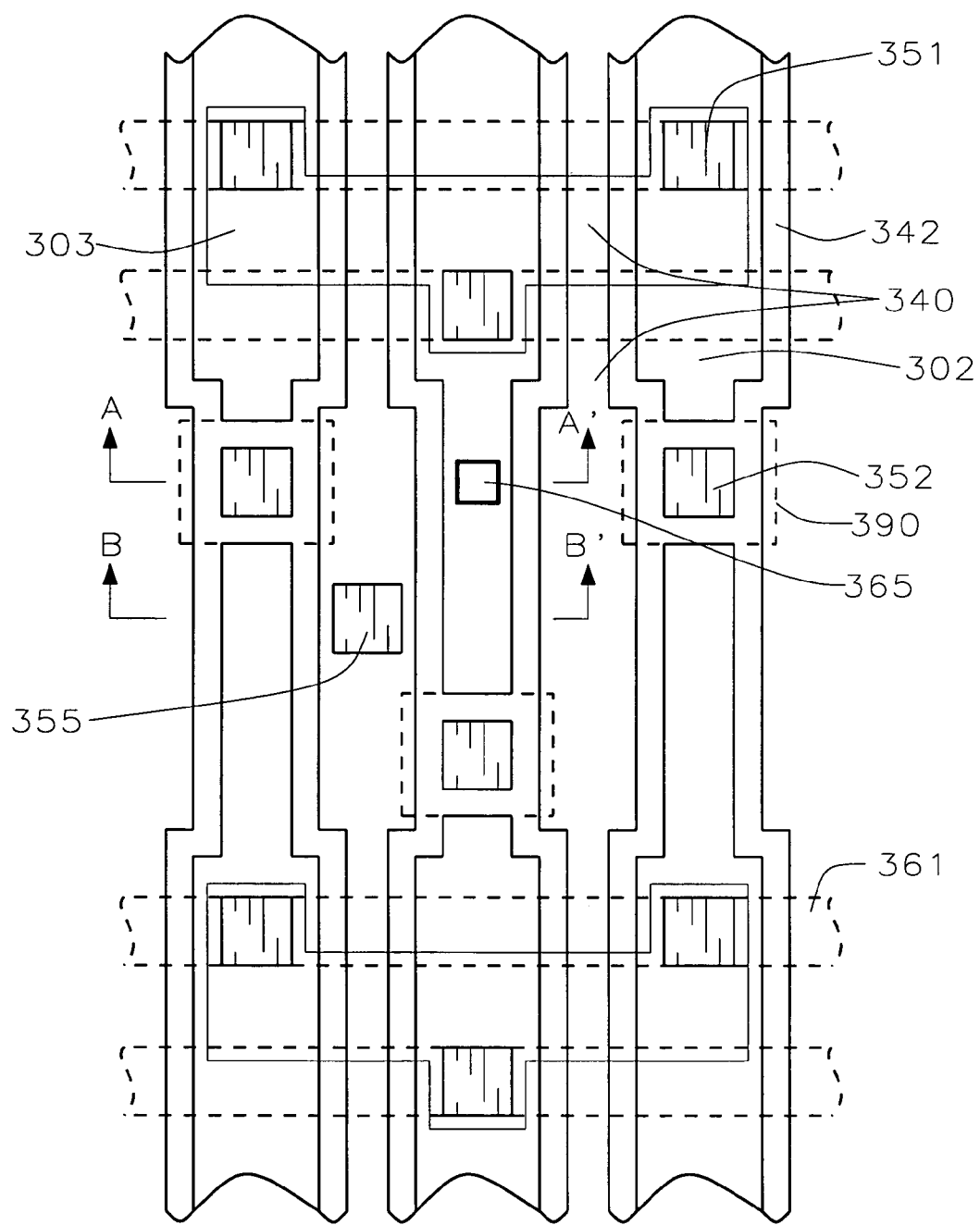
FIG. 12A is a magnified top view in the stitch area of FIG. 10C.
Figure 12B:
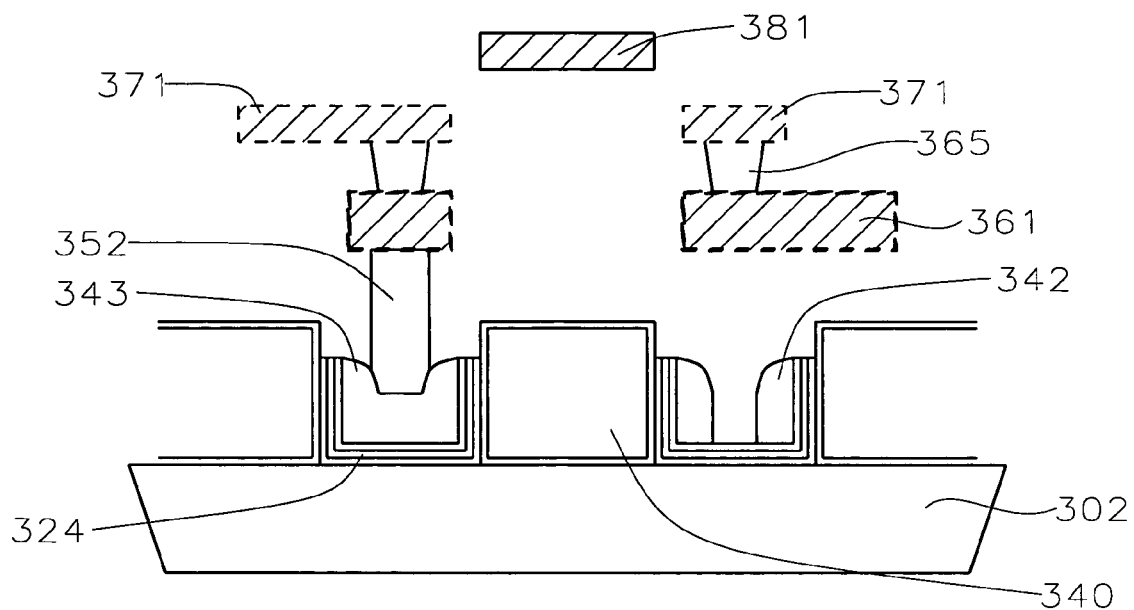
FIG. 12B is a cross sectional representation or the control gate contact area in FIG. 12A (A–A').
Figure 12C:
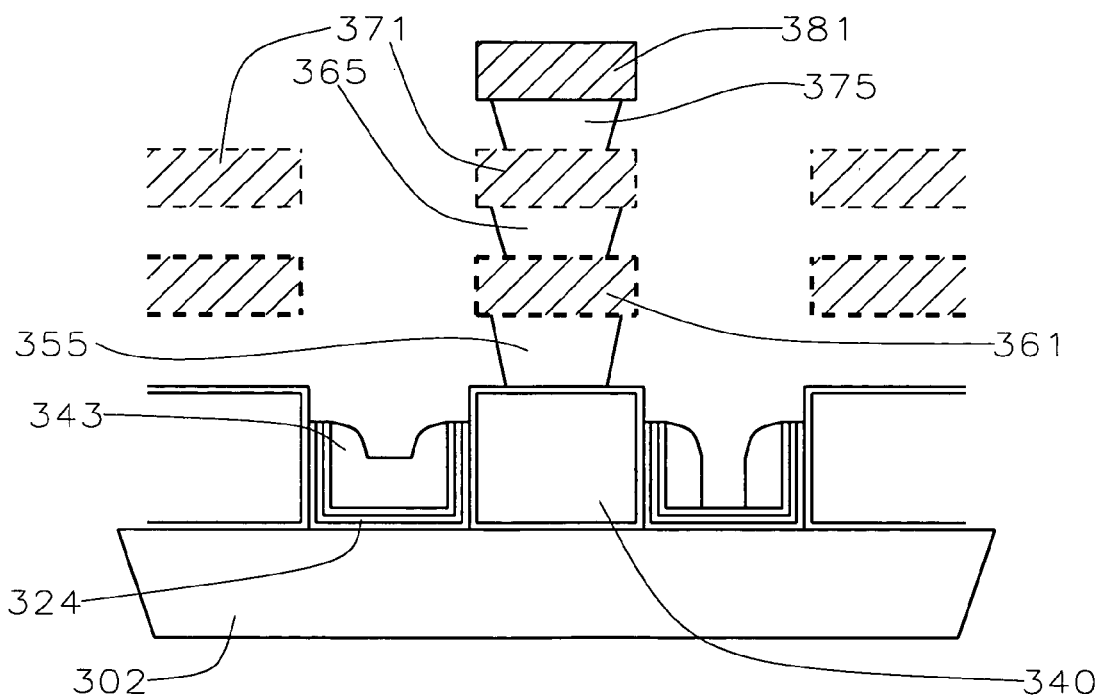
FIG. 12C is a cross sectional representation of the word gate contact area in FIG. 12A (B–B').

The diffusion of each cell is connected to first level metal (M1) 361 by a contact 351 FIG. 10C, FIG. 11B, and FIG. 12B. The polysilicon control gate lines 342 and the polysilicon word gate lines 340 run parallel to each other and orthogonally to the bit metal line 361 FIG. 12A. Metal M2 371 is used to stitch control gate 342 (FIG. 11C) and the metal M3 381 is used to stitch the word gate 340 (FIG. 1D). The word gate contact 355 is placed in the open space which is created by cutting the control gate M2 line and looping around in metal 1 in order to avoid the word gate contact area (FIG. 11C). By shifting the metal 2 and metal 3 lines half a metal pitch and looping with M2 as well as M1, every control gate line 342 and every other word gate line 340 can be contacted within the same region (FIG. 12A).

Figure 12D:
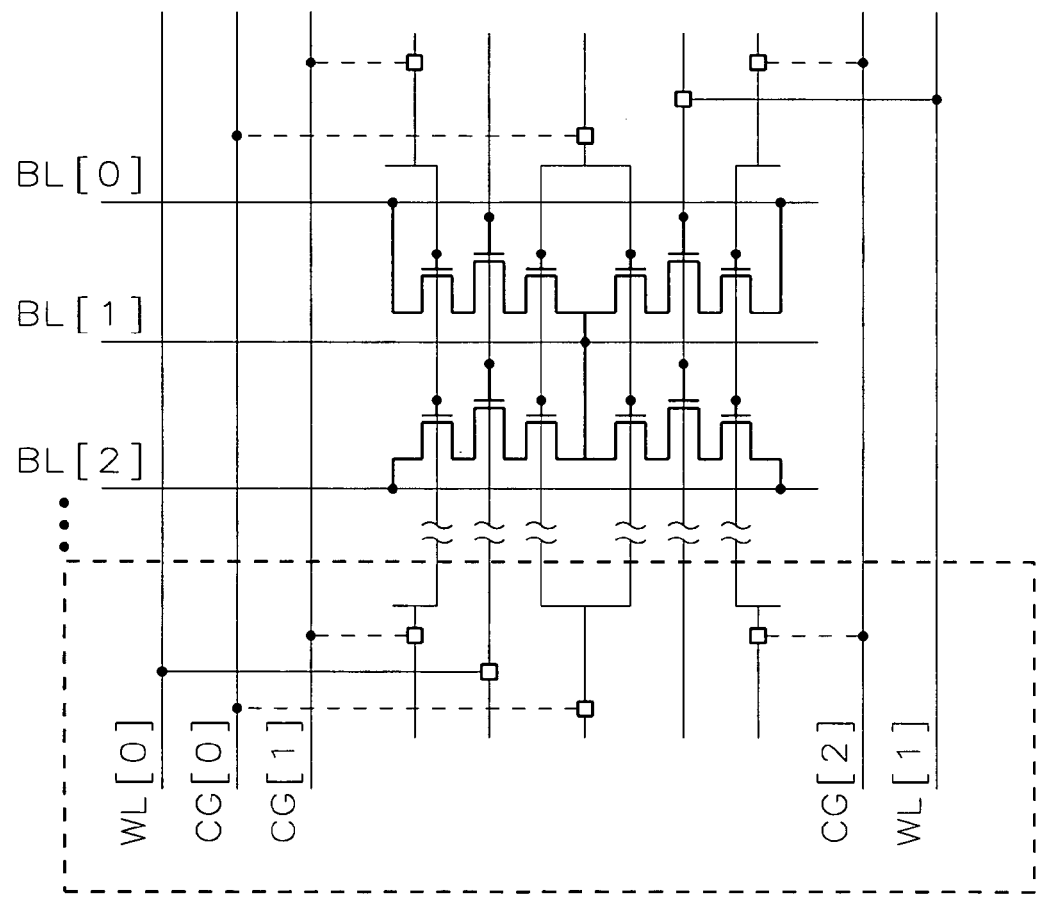
FIG. 12D is an equivalent circuit diagram of a sub array with a contact on each bit diffusion and connected by a first metal line.

The equivalent circuit diagram to this embodiment is shown in FIG. 12D. The stitch area is placed on both sides of the memory array block, defined as upper and lower stitch areas. The control gate contacts to stitch the control gate line are placed on both upper and lower areas. Word contacts are placed alternately on upper and lower areas.

The present invention provides methods stitching three high resistance lines to three low resistance metal lines within a cell size that is limited by the minimum metal pitch. Methods have been provided to form stitch contact areas for the high resistance line. Bit line select transistors and/or control gate select transistors may be provided in addition to the stitching.

While the invention has been particularly shown and described with reference to the preferred embodiments thereof, it will be understood by those skilled in the art that various changes in form and details may be made without departing from the spirit and scope of the invention.

What is claimed is:

1. A stitched MONOS memory array comprising:
   three resistive layers wherein said three resistive layers are vertically stacked as a bottom, middle, and top resistive layer and wherein said bottom and middle resistive layers run in parallel to each other and wherein said top resistive layer runs orthogonally to said bottom and middle resistive layers; and stitches periodically contacting each of said resistive layers to a respective upper conductive layer wherein said stitches comprise:

connections from said middle resistive layer to a bottom conductive layer overlying said top resistive layer;

contact/via stacks from said bottom resistive layer to a top conductive layer;

a middle conductive layer connecting cut ends of said middle resistive layer wherein said middle conductive layer overlies said bottom conductive layer and underlies said top conductive layer and wherein said middle conductive layer loops around said contact/via stacks; and connections from said top resistive layer to said middle conductive layer.

2. The memory array according to claim 1 wherein said stitches are located on alternate sets of resistive lines.

3. The memory array according to claim 1 wherein said bottom and middle resistive lines are a bit line and a control gate line and wherein said top resistive line is a word gate line.

4. The memory array according to claim 1 wherein said bottom and middle resistive lines are a word line and a control gate line and wherein said top resistive line is a bit line.

5. The memory array according to claim 1 wherein said stitches reduce resistance of said MONOS memory array.

6. The memory array according to claim 1 wherein said stitches lie within a cell size limited by a minimum metal pitch.

7. A stitched MONOS memory array comprising:

three resistive layers wherein said three resistive layers are vertically stacked as a bottom, middle, and top resistive layer and wherein said bottom and middle resistive layers run in parallel to each other and wherein said top resistive layer runs orthogonally to said bottom and middle resistive layers; and stitches periodically contacting each of said resistive layers by a respective upper conductive layer wherein said stitches comprise:

connections from said top resistive layer to a bottom conductive layer overlying said top resistive layer;

contact/via stacks from said bottom resistive layer to a top conductive layer;

a bottom conductive layer connecting cut ends of said middle resistive layer wherein said bottom conductive layer loops around said contact/via stacks; and connections from said middle resistive layer to a middle conductive layer wherein said middle conductive layer overlies said bottom conductive layer and underlies said top conductive layer.

8. The memory array according to claim 7 wherein said stitches lie on alternate sets of resistive lines.

9. The memory array according to claim 7 wherein said bottom and middle resistive lines are a bit line and a control gate line and wherein said top resistive line is a word gate line.

10. The memory array according to claim 7 wherein said bottom and middle resistive lines are a word line and a control gate line and wherein said top resistive line is a bit line.

11. The memory array according to claim 7 wherein said stitches reduce resistance of said MONOS memory array.

12. The memory array according to claim 7 wherein said stitches lie within a cell size limited by a minimum metal pitch.

13. A stitched MONOS memory array comprising:

a plurality of memory cells in a MONOS memory array wherein each memory cell comprises:

a storage cell on either side of a word gate;

a diffusion junction underlying each of said storage cells wherein each of said diffusions is shared with an adjacent storage cell of an adjacent memory cell; and a control gate overlying each of said storage cells electrically isolated from underlying said diffusion junctions wherein said control gates and said diffusions run in parallel and wherein said word gates run orthogonally to said control gates and said diffusions;

wherein word gates in said array form word lines, said control gates in said array form control gate lines, and said diffusions in said array form bit lines;

connections from said control gate lines to a bottom conductive layer overlying said word gate lines;

contact/via stacks from said bit lines to a top conductive layer;

a middle conductive layer connecting cut ends of said control gate lines wherein said middle conductive layer overlies said bottom conductive layer and underlies said top conductive layer and wherein said middle conductive layer loops around said contact/via stacks; and connections from said word gate lines to said middle conductive layer.

14. The memory array according to claim 13 wherein said connections lie on alternate sets of control gate lines, bit lines, and word lines.

15. A stitched MONOS memory array comprising:

a plurality of memory cells in a MONOS memory array wherein each memory cell comprises:

a storage cell on either side of a word gate;

a diffusion junction underlying each of said storage cells wherein each of diffusions is shared with an adjacent storage cell of an adjacent memory cell; and a control gate overlying each of said storage cells electrically isolated from underlying said diffusion junctions wherein said control gates and said diffusions run in parallel and wherein said word gates run orthogonally to said control gates and said diffusions;

wherein word gates in said array from word lines, said control gates in said array form control gate lines, and said diffusions in said array form bit lines;

connections from said control gate lines to a middle conductive layer overlying said word gate lines;

contact/via stacks from said bit lines to a top conductive layer wherein said top conductive layer overlies said middle conductive layer;

a bottom conductive layer connecting cut ends of said control gate lines wherein said bottom conductive layer underlies said middle conductive layer and wherein said bottom conductive layer loops around said contact/via stacks; and connections from said word gate lines to said bottom conductive layer.

16. The memory array according to claim 15 wherein said connections lie on alternate sets of control gate lines and bit lines.

17. A stitched MONOS memory array comprising:
   a plurality of memory cells in a MONOS memory array wherein each memory cell comprises:
      a storage cell on either side of a word gate;
      a diffusion junction underlying each of said storage cells wherein each of diffusions is shared with an adjacent storage cell of an adjacent memory cell; and
      a control gate overlying each of said storage cells electrically isolated from underlying said diffusion junctions wherein said control gates and said diffusions run in parallel and wherein said word gates run orthogonally to said control gates and said diffusions;
   wherein word gates in said array from word lines, said control gates in said array form control gate lines, and said diffusions in said array form bit lines;
   stitches periodically contacting each of said word lines, control gate lines, and bit lines by a respective upper conductive layer wherein said contacting comprises:
      connections from said control gate lines to a middle conductive layer overlying said word gate lines;
      contact/via stacks from said bit lines to a top conductive layer wherein said top conductive layer overlies said middle conductive layer;
      a bottom conductive layer connecting cut ends of said control gate lines wherein said bottom conductive layer underlies said middle conductive layer and wherein said bottom conductive layer loops around said contact/via stacks; and
      connections from said word gate lines to said bottom conductive layer; and
      select transistors in areas of said stitching between sub-arrays of said MONOS memory cells.

18. The memory array according to claim 17 wherein said stitches lie on alternate sets of control gate lines and bit lines.

19. The memory array according to claim 17 wherein said select transistors comprise:
   extensions of alternate said bit diffusions past an edge of said control gates;
   bit line select transistors placed alternately with said extended bit diffusions on either side of each of said sub-arrays and horizontally across said extended bit diffusions wherein unextended said bit diffusions are connected to said bit lines by contact stacks to said middle conductive layer.

20. The memory array according to claim 17 wherein said select transistors comprise:
   pairs of control gate select transistors between said sub-arrays; and
   control gate contacts over shallow trench isolation areas wherein center control gate contacts lie between two control gate select transistors of a pair and wherein outer control gate contacts lie on outer sides of each of said pairs, wherein said center control gate contacts are connected to said control gate lines by said top conductive layer and wherein said outer control gates contact control gates of a nearest said sub-array.

21. The memory array according to claim 20 wherein each of said sub-array control gates is connected by said bottom conductive layer to a source diffusion of said control gate select transistor.

22. The memory array according to claim 20 wherein each of said sub-array control gates is extended to a source diffusion of a corresponding said control gate select transistor thereby directly connecting each of said control gates to a corresponding control gate select transistor source diffusion.

23. The memory array according to claim 20 wherein said control gate select transistors are chosen from the group consisting of: an N-channel device in an isolated P-well, and a P-channel device in an independent N-well.

24. The memory array according to claim 20 wherein said pairs of control gate select transistors run in parallel with said word lines and perpendicular to said bit lines and said control gate lines.

25. The memory array according to claim 17 wherein said select transistors comprise:
   extensions of alternate said bit diffusions past an edge of said control gates;
   bit line select transistors placed alternately with said extended bit diffusions on either side of each of said sub-arrays and horizontally across said extended bit diffusions wherein unextended said bit diffusions are connected to said bit lines by contact stacks to said middle conductive layer;
   pairs of control gate select transistors placed out of phase with and between two of said bit line select transistors inside two edges of two said sub-arrays; and
   control gate contacts over shallow trench isolation areas wherein center control gate contacts lie between two control gate select transistors of a pair and wherein outer control gate contacts lie on outer sides of each of said pairs, wherein said center control gate contacts are connected to said control gate lines by said top conductive layer and wherein said outer control gates contact control gates of a nearest said sub-array.

26. The memory array according to claim 25 wherein each of said sub-array control gates is connected by said bottom conductive layer to a source diffusion of said control gate select transistor.

27. The memory array according to claim 25 wherein each of said sub-array control gates is extended to a source diffusion of a corresponding said control gate select transistor thereby directly connecting each of said control gates to a corresponding control gate select transistor source diffusion.

28. The memory array according to claim 25 wherein said control gate select transistors are chosen from the group consisting of: an N-channel device in an isolated P-well, and a P-channel device in an independent N-well.

29. The memory array according to claim 25 wherein said pairs of control gate select transistors run in parallel with said word lines and perpendicular to said bit lines and said control gate lines.

30. A stitched MONOS memory array comprising:
   a plurality of memory cells in a MONOS memory array wherein each memory cell comprises:
      a storage cell on either side of a word gate;
      a diffusion junction underlying each of said storage cells wherein each of said diffusions is shared with an adjacent storage cell of an adjacent memory cell; and
      a control gate overlying each of said storage cells electrically isolated from underlying said diffusion junctions wherein said control gates and said word gates run in parallel and wherein said diffusions run orthogonally to said control gates and said word gates;
   wherein word gates in said array form word lines, said control gates in said array form control gate lines, and said diffusions in said array form bit lines;

connections from said bit lines to a bottom conductive layer overlying said word gate lines;
connections from said control gate lines to a middle conductive layer;
contact/via stacks from said word gate lines to a top conductive layer overlying said middle conductive layer; and
a bottom conductive layer contacting said control gate lines wherein said bottom conductive layer underlies said middle conductive layer and loops around said contact/via stacks.

31. The memory array according to claim 30 wherein said connections lie on alternate sets of control gate lines and word lines.

32. The memory array according to claim 30 wherein said middle conductive line and said top conductive line are shifted by half a metal pitch, wherein said middle conductive layer also loops around said contact/via stack, and wherein said connections lie on every control gate line and on alternate sets of word lines.

* * * * *